US008916921B2

(12) United States Patent
Tanaka et al.

(10) Patent No.: US 8,916,921 B2
(45) Date of Patent: Dec. 23, 2014

(54) NON-VOLATILE SEMICONDUCTOR STORAGE DEVICE INCLUDING A DIELECTRIC WITH LOW PERMITTIVITY IN MEMORY CELLS ARRANGED IN A THREE DIMENSIONAL MANNER

(75) Inventors: Hiroyasu Tanaka, Tokyo (JP); Hideaki Aochi, Kawasaki (JP); Ryota Katsumata, Yokohama (JP); Masaru Kidoh, Komae (JP); Masaru Kito, Yokohama (JP); Yoshiaki Fukuzumi, Yokohama (JP); Yosuke Komori, Yokohama (JP); Megumi Ishiduki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 12/705,088

(22) Filed: Feb. 12, 2010

(65) Prior Publication Data
US 2010/0207193 A1    Aug. 19, 2010

(30) Foreign Application Priority Data
Feb. 16, 2009   (JP) ................................. 2009-032697

(51) Int. Cl.
*H01L 29/792*    (2006.01)
*H01L 27/115*    (2006.01)
*G11C 16/04*    (2006.01)

(52) U.S. Cl.
CPC .... *H01L 27/11578* (2013.01); *H01L 27/11582* (2013.01); *G11C 16/0483* (2013.01)
USPC ......................................................... 257/324

(58) Field of Classification Search
CPC .................. H01L 27/11578; H01L 27/11582; G11C 16/0483
USPC ........................................................ 257/324
See application file for complete search history.

(56) References Cited

U.S. PATENT DOCUMENTS

| 6,870,215 B2 | 3/2005 | Endoh et al. |
| 2002/0195668 A1* | 12/2002 | Endoh et al. ................. 257/390 |
| 2004/0232496 A1* | 11/2004 | Chen et al. .................... 257/390 |

(Continued)

FOREIGN PATENT DOCUMENTS

| JP | 2007-266143 | 10/2007 |
| JP | 2008-186868 | 8/2008 |
| WO | WO 2009/075370 A1 | 6/2009 |

OTHER PUBLICATIONS

U.S. Appl. No. 12/679,991, filed Mar. 25, 2010, Fukuzumi et al.

*Primary Examiner* — Fernando L Toledo
*Assistant Examiner* — Peter Bradford
(74) *Attorney, Agent, or Firm* — Oblon, Spivak, McClelland, Maier & Neustadt, L.L.P.

(57) ABSTRACT

A plurality of a first conductive layers are provided at a certain interval L in a vertical direction, with a dielectric sandwiched therebetween. The certain interval L is set so that the first dielectric has an equivalent oxide thickness $D_{EOT}$ that satisfies the following relation (1).

$$D_{sio2} < D_{EOT} < D_k \quad (1)$$

$D_{sio2}$ denotes a thickness of the dielectric when the dielectric is composed of silicon oxide with a minimum thickness that can withstand a maximum voltage to be applied to the first conductive layers. $D_k$ denotes such an equivalent oxide thickness of a first dielectric that provides the resistance value Rsio2. The resistance value Rsio2 being defined as a resistance value of the first semiconductor layer for each of the first conductive layers when the dielectric is composed of silicon oxide and has a film thickness of $D_{sio2}$.

8 Claims, 19 Drawing Sheets

(56) References Cited

U.S. PATENT DOCUMENTS

| | | |
|---|---|---|
| 2006/0285375 A1* | 12/2006 | Endo et al. .................... 365/63 |
| 2007/0131980 A1* | 6/2007 | Lung ........................... 257/246 |
| 2007/0252201 A1 | 11/2007 | Kito et al. |
| 2007/0262301 A1* | 11/2007 | Cowburn et al. ............... 257/40 |
| 2008/0099819 A1* | 5/2008 | Kito et al. .................... 257/315 |
| 2008/0144364 A1* | 6/2008 | Lee et al. ..................... 365/164 |
| 2008/0179659 A1* | 7/2008 | Enda et al. .................... 257/326 |
| 2009/0001442 A1* | 1/2009 | Ozawa et al. ................. 257/315 |
| 2010/0172183 A1* | 7/2010 | Lue et al. .................. 365/185.18 |

* cited by examiner

FIG. 17 Dielectric between Word-Line Conductive Layers 31a to 31d: SiO2
Interval (Physical Film Thickness) between Word-Line Conductive Layers 31a to 31d: 35nm

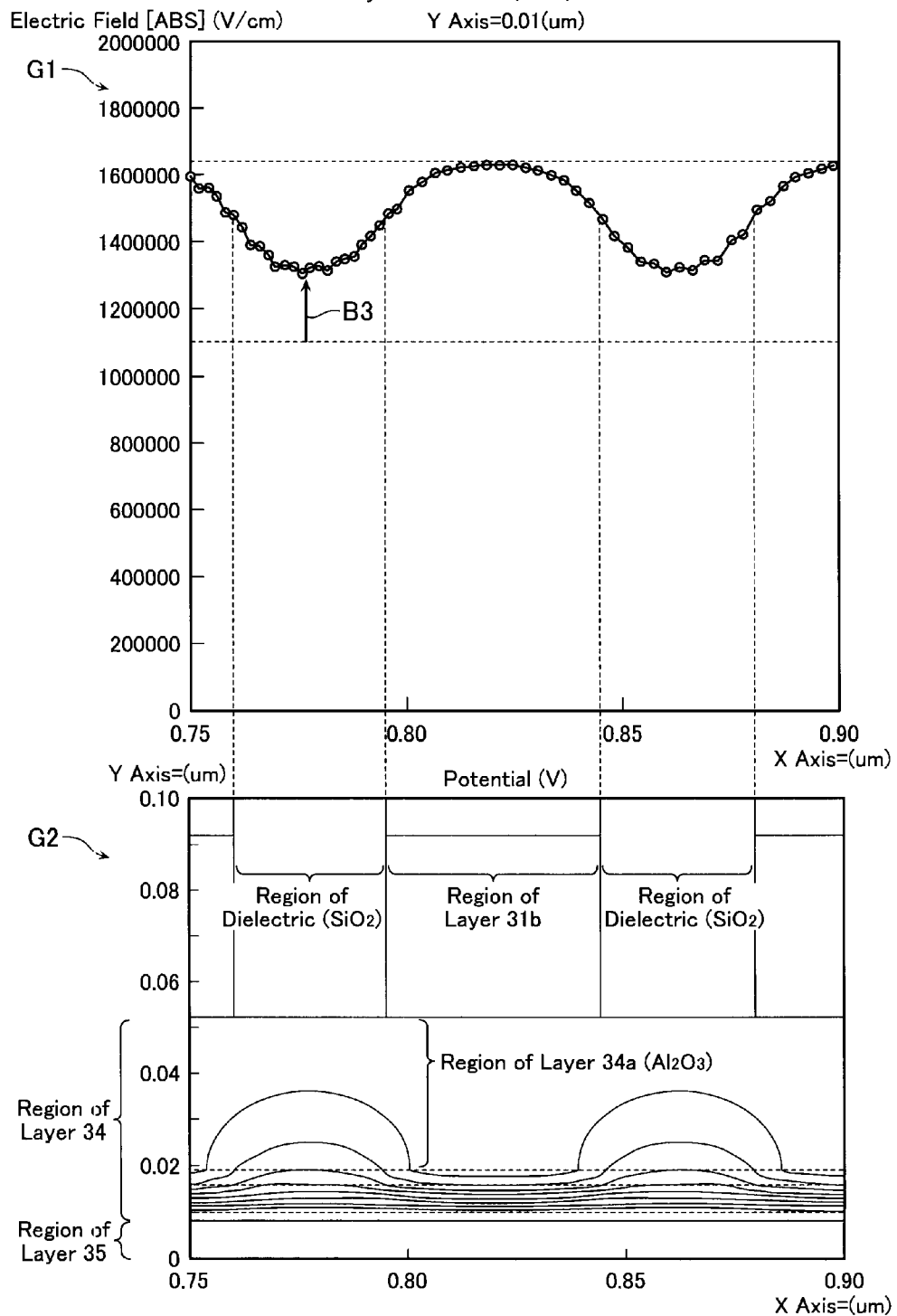
FIG. 21 Dielectric between Word-Line Conductive Layers 31a to 31d: SiO2 (k=3.9)
Interval (Physical Film Thickness) between Word-Line Conductive Layers 31a to 31d: 35nm
Block Insulation Layer 34a: Al2O3 (k=10)

NON-VOLATILE SEMICONDUCTOR STORAGE DEVICE INCLUDING A DIELECTRIC WITH LOW PERMITTIVITY IN MEMORY CELLS ARRANGED IN A THREE DIMENSIONAL MANNER

CROSS-REFERENCE TO RELATED APPLICATIONS

This application is based upon and claims the benefit of priority from the prior Japanese Patent Application No. 2009-32697, filed on Feb. 16, 2009, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Conventionally, LSIs are formed by integration of devices in a two-dimensional plane on the silicon substrate. Although the dimension for each device are commonly reduced (refined) to increase memory storage capacity, recent years are facing challenges in such refinement from the viewpoint of cost and technology. Such refinement requires further improvements in photolithography technology. However, the costs of lithography process are ever increasing. In addition, if such refinement is accomplished, it is assumed that physical improvement limit, such as in breakdown voltage between devices, would be reached unless driving voltage can be scaled. That is, it is likely that difficulties would be encountered in device operation itself.

Therefore, such semiconductor storage devices have been proposed recently where memory cells are arranged in a three-dimensional manner to achieve improved integration of memory devices (see, Patent Document 1: Japanese Patent Laid-Open No. 2007-266143).

One of the conventional semiconductor storage devices where memory cells are arranged in a three-dimensional manner uses transistors with a cylinder-type structure (Patent Document 1). Those semiconductor storage devices using transistors with the cylinder-type structure are provided with multiple conductive layers corresponding to gate electrodes and pillar-like columnar semiconductors. Interlayer insulation layers of silicon oxide ($SiO_2$) are provided above and below respective conductive layers. Each columnar semiconductor layer serves as a channel (body) part of a respective transistor. Memory gate insulation layers are provided around the columnar semiconductor layers. Such a configuration including these conductive layers, columnar semiconductor layers, and memory gate insulation layers is referred to as a "memory string".

However, in each memory string, the columnar semiconductor layer comprises polysilicon with little impurities. Thus, it is difficult to reduce the resistance of the columnar semiconductor layer to a desired value taking a leakage electric field from the conductive layers into consideration. That is, conventional techniques suffer from insufficient current in reading.

As such, attempts are made to reduce the resistance value of columnar semiconductor layers by reducing the film thickness of each interlayer insulation layer between respective conductive layers. However, another problem arises that the voltage in memory writing can exceed the breakdown voltage of the interlayer insulation layers. This means that an improved technology is desired that increases cell currents during read operation, while obtaining the breakdown voltage of the interlayer insulation layers.

SUMMARY OF THE INVENTION

One aspect of the present invention provides a non-volatile semiconductor storage device comprising: a plurality of memory strings each having a plurality of electrically rewritable memory cells connected in series, each of the memory strings comprising: a first semiconductor layer having a columnar portion extending in a vertical direction to a substrate; an electric charge accumulation layer surrounding a side surface of the first semiconductor layer; and a plurality of first conductive layers surrounding a side surface of the electric charge accumulation layer and functioning as control electrodes of the memory cells, the plurality of first conductive layers being provided at a certain interval L in the vertical direction, with a dielectric sandwiched therebetween, the dielectric including a first dielectric with a lower dielectric constant than that of silicon oxide, the certain interval L being set so that the first dielectric has an equivalent oxide thickness $D_{EOT}$ that satisfies the following relation (1):

$$D_{sio2} < D_{EOT} < D_k \quad (1)$$

(where $D_{sio2}$ denotes a thickness of the dielectric when the dielectric is composed of silicon oxide with a minimum thickness that can withstand a maximum voltage to be applied to the first conductive layers, and, $D_k$ denotes such an equivalent oxide thickness of a first dielectric that provides the resistance value Rsio2, the resistance value Rsio2 being defined as a resistance value of the first semiconductor layer for each of the first conductive layers when the dielectric is composed of silicon oxide and has a film thickness of $D_{sio2}$.)

Another aspect of the present invention provides a non-volatile semiconductor storage device comprising: a plurality of memory strings each having a plurality of electrically rewritable memory cells connected in series, each of the memory strings comprising: a first semiconductor layer having a columnar portion extending in a vertical direction to a substrate; a first insulation layer surrounding a side surface of the first semiconductor layer; an electric charge accumulation layer surrounding a side surface of the first insulation layer; a second insulation layer surrounding a side surface of the electric charge accumulation layer; and a plurality of first conductive layers surrounding a side surface of the second insulation layer and functioning as control electrodes of the memory cells, the second insulation layer having a higher dielectric constant than that of silicon oxide.

Still another aspect of the present invention provides a method of manufacturing a non-volatile semiconductor storage device having a plurality of memory strings each having a plurality of electrically rewritable memory cells connected in series, the method comprising: laminating a conductive layer via a sacrificial layer; forming a hole so as to penetrate the sacrificial layer and the conductive layer; sequentially forming a first insulation layer, an electric charge accumulation layer, and a second insulation layer on a side surface of the hole; forming a semiconductor layer so as to fill up the hole; forming a trench so as to penetrate the sacrificial layer and the conductive layer; forming a gap by removing the sacrificial layer through the trench; and forming a dielectric in the gap, a plurality of the conductive layers being provided at a certain interval L in the vertical direction, with the dielectric sandwiched therebetween, the dielectric including a first dielectric with a lower dielectric constant than that of silicon oxide, the certain interval L being set so that the first dielectric has an equivalent oxide thickness $D_{EOT}$ that satisfies the following relation (2):

$$D_{sio2} < D_{EOT} < D_k \quad (2)$$

(where $D_{sio2}$ denotes a thickness of the dielectric when the dielectric is composed of silicon oxide with a minimum thickness that can withstand a maximum voltage to be applied to the first conductive layers, and, $D_k$ denotes such an equivalent oxide thickness of a first dielectric that provides the resistance value Rsio2, the resistance value Rsio2 being defined as a resistance value of the first semiconductor layer for each of the first conductive layers when the dielectric is composed of silicon oxide and has a film thickness of $D_{sio2}$.)

BRIEF DESCRIPTION OF THE DRAWINGS

FIG. 21 illustrates the electric field and its distribution when silicon nitride ($SiO_2$) with a film thickness of 35 nm is provided between the word-line conductive layers 31a to 31d and when the block insulation layers 34a comprise aluminum oxide ($Al_2O_3$).

DETAILED DESCRIPTION OF THE EMBODIMENTS

Embodiments of a non-volatile semiconductor storage device according to the present invention will now be described below with reference to the accompanying drawings.

First Embodiment

Figure 1:
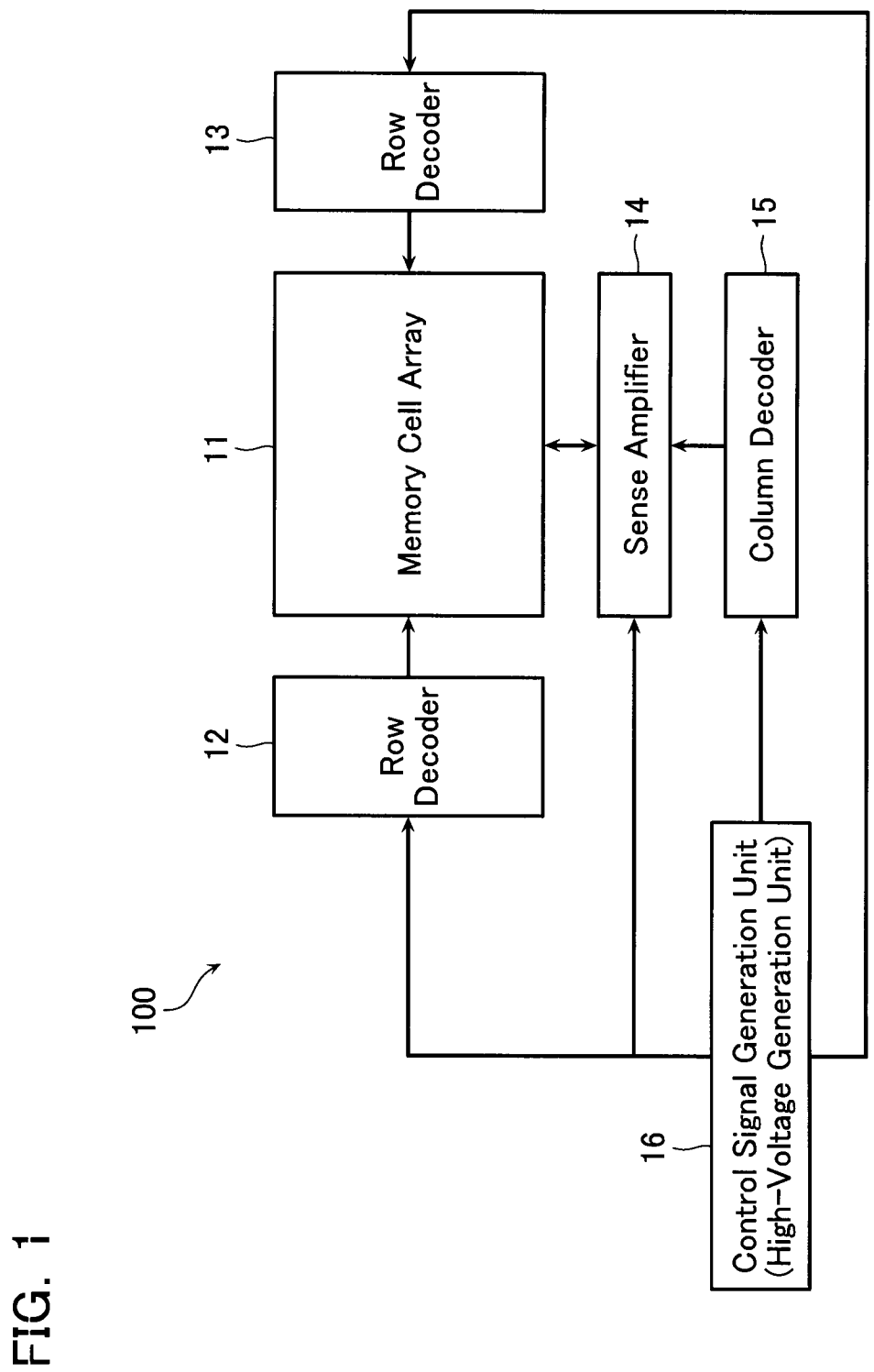
FIG. 1 is a block diagram of a non-volatile semiconductor storage device 100 according to a first embodiment of the present invention.

Configuration of Non-Volatile Semiconductor Storage Device 100 in First Embodiment Referring first to FIG. 1, a configuration of a non-volatile semiconductor storage device 100 according to a first embodiment will be described below. FIG. 1 is a block diagram of the non-volatile semiconductor storage device 100 according to the first embodiment of the present invention.

As illustrated in FIG. 1, the non-volatile semiconductor storage device 100 of the first embodiment comprises: a memory cell array 11; row decoders 12 and 13; a sense amplifier 14; a column decoder 15; and a control signal generation unit (high-voltage generation unit) 16.

The memory cell array 11 has memory transistors MTr for electrically storing data. The row decoders 12 and 13 decode captured block address signals and row address signals to control the memory cell array 11. The sense amplifier 14 reads data from the memory cell array 11. The column decoder 15 decodes column address signals to control the sense amplifier 14. The control signal generation unit 16 boosts a reference voltage to generate a high voltage that is required at the time of write and erase operations. Furthermore, it generates a control signal to control the row decoders 12 and 13, the sense amplifier 14, and the column decoder 15.

Figure 2:
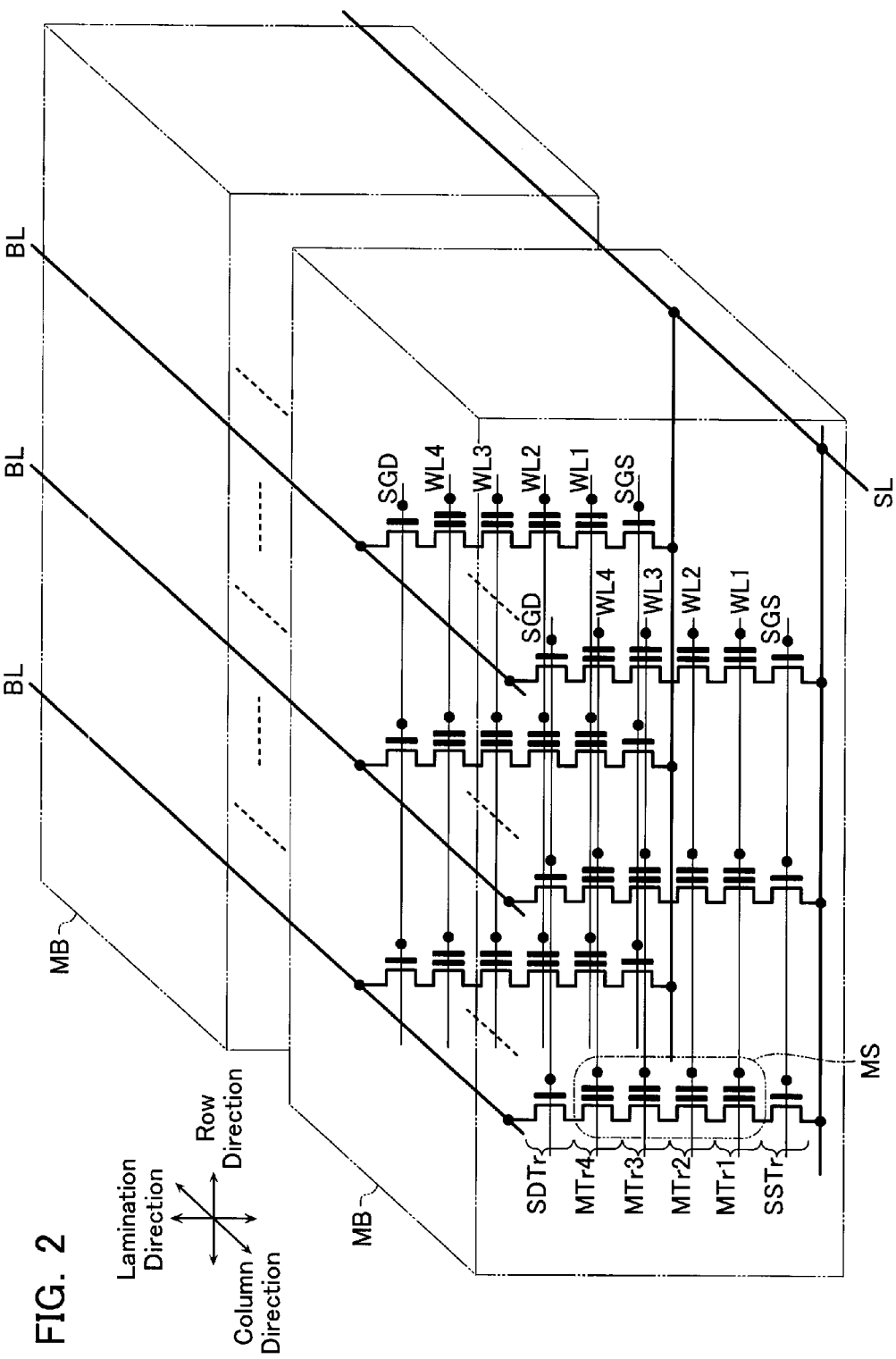
FIG. 2 is a partial circuit diagram of the non-volatile semiconductor storage device 100 according to the first embodiment.
Figure 3:
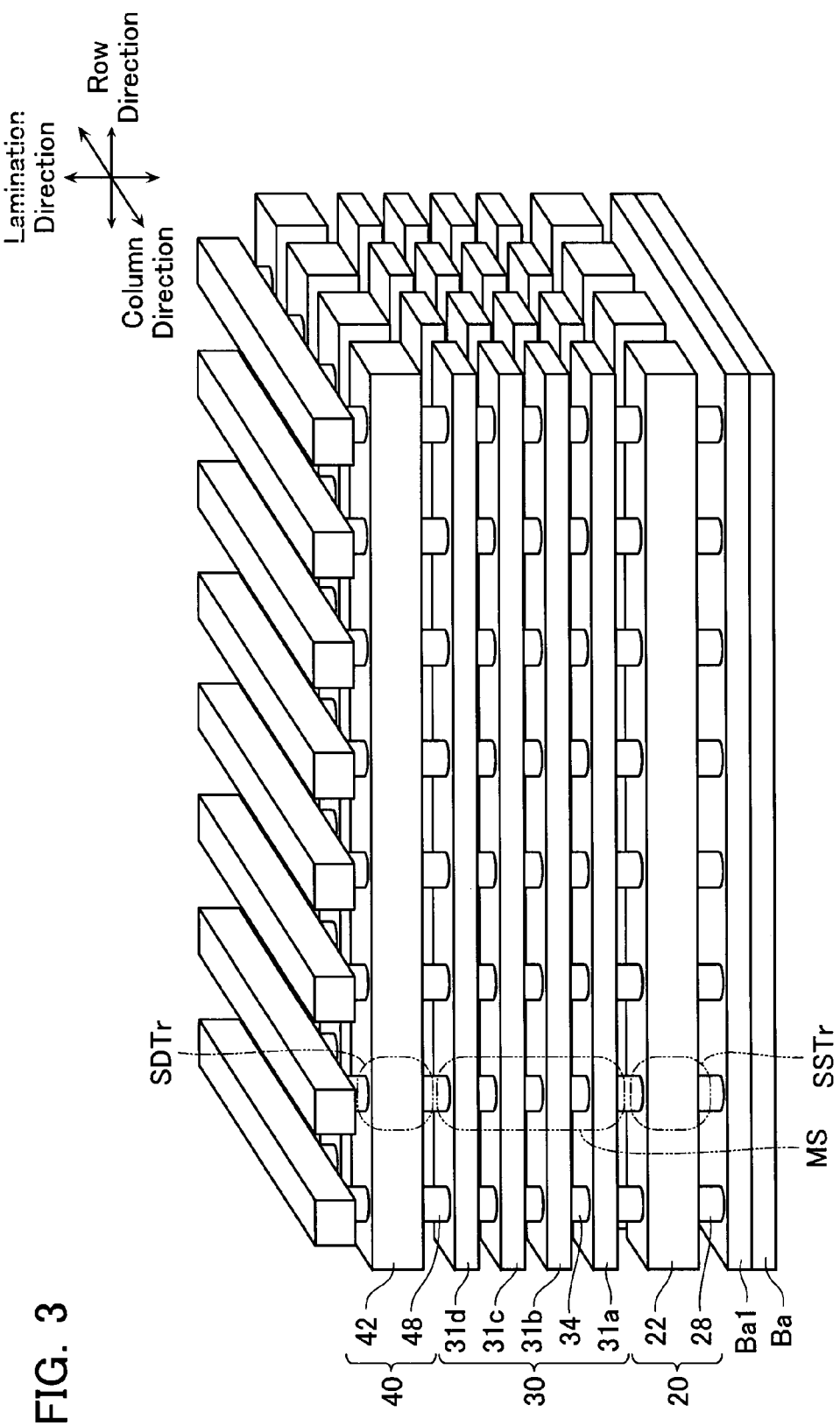
FIG. 3 is a perspective view of the non-volatile semiconductor storage device 100 according to the first embodiment where some parts thereof are omitted for clarity.
Figure 4:
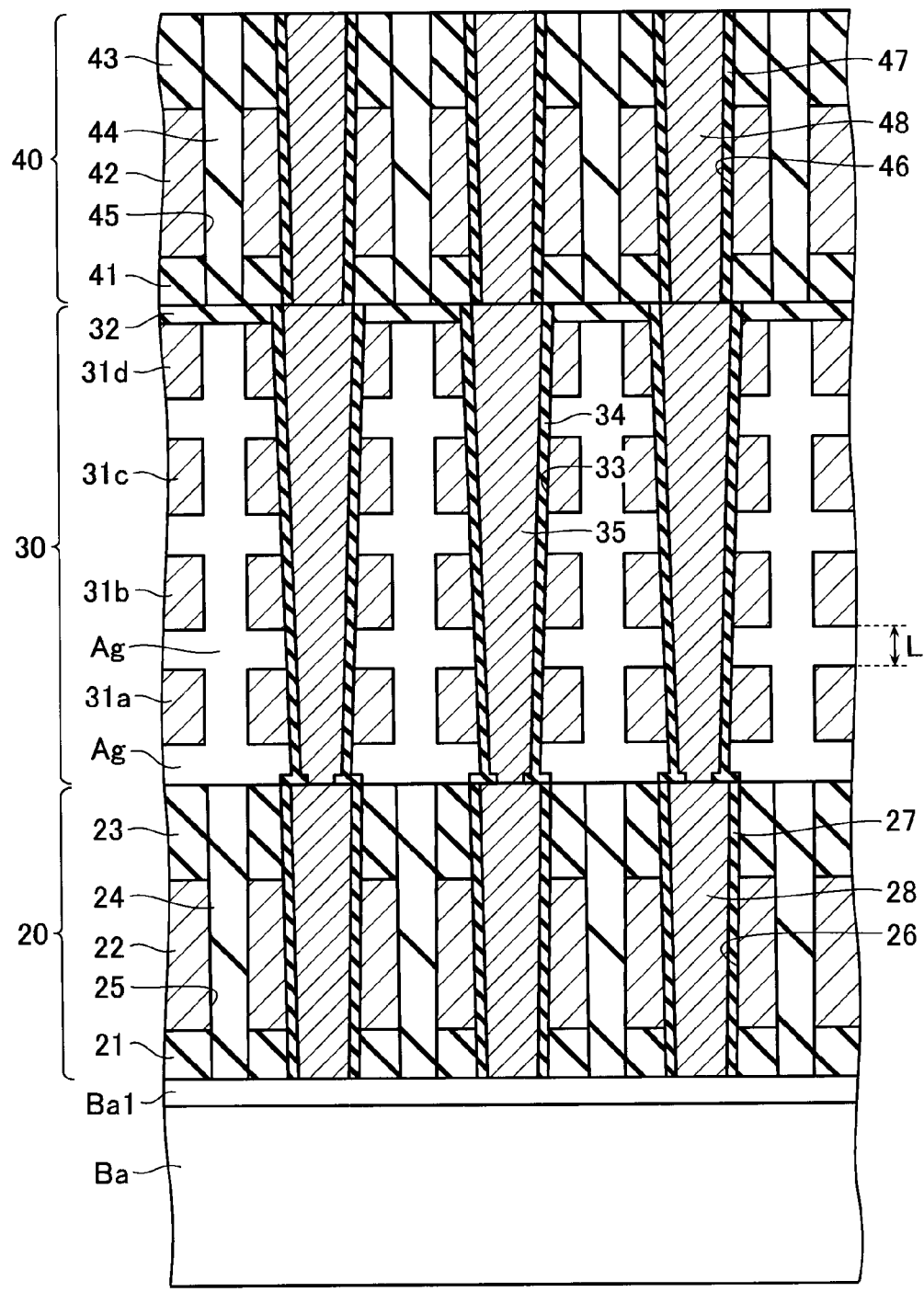
FIG. 4 is a cross-sectional view of the non-volatile semiconductor storage device 100 according to the first embodiment.

Referring now to FIGS. 2 to 4, a lamination structure and a circuit configuration of the memory cell array 11 will be described below. FIG. 2 is a schematic perspective view of a memory cell array 11. FIG. 3 is an enlarged view of FIG. 2. FIG. 4 is a cross-sectional view of FIG. 3. Wherein, the row direction represents a direction orthogonal to the lamination direction and the column direction represents another orthogonal to the lamination direction and the row direction. Note that interlayer insulation layers provided between wirings are omitted from FIG. 3.

As illustrated in FIG. 2, the memory cell array 11 has a plurality of memory blocks MB. The memory blocks MB are arranged in the column direction on a semiconductor substrate Ba (not illustrated). In other words, one memory block MB is formed for each certain region on the semiconductor substrate Ba.

As illustrated in FIG. 2, each memory block MB comprises a plurality of memory strings MS, source-side selection transistors SSTr, and drain-side selection transistors SDTr. Each memory string MS includes memory transistors MTr1 to MTr4 connected in series. Each drain-side selection transistor SDTr is connected to one end (a memory transistor MTr4) of a respective memory string MS. Each source-side selection transistor SSTr is connected to the other end (a memory transistor MTr1) of a respective memory string MS.

As illustrated in FIG. 2, in each memory block MB, the control gates of the memory transistors MTr1 aligned in the row direction are commonly connected to a word line WL1 extending in the row direction. Similarly, the control gates of the memory transistors MTr2 aligned in the row direction are commonly connected to a word line WL2 extending in the row direction. The control gates of the memory transistors MTr3 aligned in the row direction are commonly connected to a word line WL3 extending in the row direction. The control gates of the memory transistors MTr4 aligned in the row direction are commonly connected to a word line WL4 extending in the row direction. The word lines WL1 to WL4 are controlled by independent signals.

As illustrated in FIG. 2, in each memory block MB, the control gates of the drain-side selection transistors SDTr aligned in the row direction are commonly connected to a drain-side selection gate line SGD. Each drain-side selection gate line SGD is formed to extend in the row direction. A plurality of drain-side selection gate lines SGD, which are provided in the column direction, are controlled by independent signals. In addition, the other ends of the drain-side selection transistors SDTr arranged in the column direction are commonly connected to a bit line BL. Each bit line BL is formed to extend in the column direction across the memory blocks MB. A plurality of bit lines BL, which are provided in the row direction, are controlled by independent signals.

As illustrated in FIG. 2, in each memory block MB, the control gates of the source-side selection transistors SSTr aligned in the row direction are commonly connected to a source-side selection gate line SGS. Each source-side selection gate line SGS is formed to extend in the row direction. A plurality of source-side selection gate lines SGS, which are provided in the column direction, are controlled by independent signals. In addition, the other ends of the source-side selection transistors SSTr arranged in the column direction are commonly connected to a source line SL.

The circuit configuration of the memory blocks MB as described above is achieved by the lamination structure illustrated in FIGS. 3 and 4. Each memory block MB has a source-side selection transistor layer 20, a memory transistor layer 30, and a drain-side selection transistor layer 40 that are sequentially laminated on the semiconductor substrate Ba.

The source-side selection transistor layer 20 is a layer that functions as source-side selection transistors SSTr. The memory transistor layer 30 is a layer that functions as memory strings MS (memory transistors MTr1 to MTr4). The drain-side selection transistor layer 40 is a layer that functions as drain-side selection transistors SDTr.

As illustrated in FIGS. 3 and 4, the semiconductor substrate Ba has a diffusion layer Ba1 on its top surface. The diffusion layer Ba1 functions as a source line SL.

As illustrated in FIGS. 3 and 4, the source-side selection transistor layer 20 has source-side first insulation layers 21, source-side conductive layers 22, source-side second insulation layers 23 and interlayer insulation layers 24 on the semiconductor substrate Ba.

The source-side first insulation layers 21, the source-side conductive layers 22, and the source-side second insulation layers 23 are sequentially laminated on the semiconductor substrate Ba. The source-side first insulation layers 21, the source-side conductive layers 22, and the source-side second insulation layers 23 are formed in a stripe pattern extending in the row direction at a certain pitch in the column direction. That is, the respective side surfaces of the source-side first insulation layers 21, the source-side conductive layers 22, and the source-side second insulation layers involve trenches 25 extending in the row direction. The interlayer insulation layers 24 are formed to fill up the trenches 25.

The source-side first insulation layers 21, the source-side second insulation layers 23, and the interlayer insulation layers 24 comprise silicon oxide ($SiO_2$). The source-side conductive layers 22 comprise polysilicon (p-Si).

As illustrated in FIG. 4, the source-side selection transistor layer 20 has source-side holes 26.

Each source-side hole 26 is formed to penetrate a source-side first insulation layer 21, a source-side conductive layer 22, and a source-side second insulation layer 23. The source-side holes 26 are formed at positions matching the diffusion layer Ba1 on the semiconductor substrate Ba. The source-side holes 26 are formed in a matrix form within a plane provided in the row and column directions.

As illustrated in FIGS. 3 and 4, the source-side selection transistor layer 20 has source-side gate insulation layers 27 and source-side columnar semiconductor layers 28.

The source-side gate insulation layers 27 are formed with a certain thickness on the side surfaces of the source-side holes 26. The source-side columnar semiconductor layers 28 are formed in a columnar shape extending in the lamination direction. The source-side columnar semiconductor layers 28 are formed in contact with the side surfaces of the source-side gate insulation layers 27 and the top surface of the diffusion layer Ba1. The source-side columnar semiconductor layers 28 are formed to fill up the source-side holes 26. The source-side columnar semiconductor layers 28 are formed in a matrix form within a plane provided in the row and column directions.

The source-side gate insulation layers 27 comprise aluminum oxide ($Al_2O_3$) (dielectric constant: k=10) or silicon oxide ($SiO_2$) (dielectric constant: k=3.9). The source-side columnar semiconductor layers 28 comprise polysilicon (p-Si).

In the configuration of the source-side selection transistor layer 20, the source-side conductive layers 22 function as the control gate electrodes of source-side selection transistors SSTr. In addition, the source-side conductive layers 22 function as source-side selection gate lines SGS.

The above-mentioned configuration of the source-side selection transistor layer 20 is restated as follows: the source-side gate insulation layers 27 are formed to surround the source-side columnar semiconductor layers 28; and the source-side conductive layers 22 are formed to surround the source-side gate insulation layers 27.

As illustrated in FIGS. 3 and 4, the memory transistor layer 30 has word-line conductive layers 31a to 31d and protection layers 32 on the source-side selection transistor layer 20.

The word-line conductive layers 31a to 31d are formed in a stripe pattern extending in the row direction at a certain pitch in the column direction. Gaps Ag are provided at the side surfaces in the column direction of the word-line conductive layers 31a to 31d. That is, the word-line conductive layers 31a to 31d are formed through gaps Ag one above the other.

The word-line conductive layers 31a to 31d are formed at a certain interval L in a vertical direction to the semiconductor substrate Ba. The gaps Ag formed between the word-line conductive layers 31a to 31d are filled with air, for example, i.e., under a substantially vacuum condition (k≈1) (dielectric).

In this case, a certain interval L is set to be smaller than an interval at which a certain destructive breakdown voltage M(V) would be obtained when the gaps between the word-line conductive layers 31a to 31d are filled up with the interlayer insulation layers of silicon oxide ($SiO_2$). This may reduce the resistance value of memory columnar semiconductor layers 35 and increase cell currents during read operation, as described below.

That is, the interlayer insulation layers of silicon oxide are broken down upon application of an electric field of on the order of $10^9$ (V/m). Thus, the interlayer insulation layers of silicon oxide cannot be made thinner than M(nm) if the destructive breakdown voltage is set to M(V). For example, if the destructive breakdown voltage M is set to 35 (V), then the above-mentioned interlayer insulation layers (silicon oxide) must be set to have a thickness (physical film thickness) of at least 35 (nm) or more.

However, in the first embodiment, a dielectric (air) with a lower permittivity than silicon oxide is provided in the gaps Ag between the word-line conductive layers 31a to 31d, and the dielectric is set to have a smaller thickness (certain interval L: physical film thickness) than that in silicon oxide, under the same destructive breakdown voltage condition. A specific range of values for a certain interval L is determined based on an equivalent oxide thickness $D_{EOT}$, which is the thickness of silicon oxide providing the same capacity, as described below.

The protection layers 32 are formed on the top surfaces of the fourth word-line conductive layers 31d. The protection layers 32 are formed to expand in a two-dimensional manner over a certain region in the row and column directions.

The word-line conductive layers 31a to 31d comprise polysilicon (p-Si). The protection layers 32 comprise silicon nitride (SiN). As described above, there are gaps Ag between the word-line conductive layers 31a to 31d. In addition, the gaps Ag are maintained under a substantially vacuum condition (k≈1). That is, the dielectric constant between the word-line conductive layers 31a to 31d is substantially equal to "1", which is smaller than the dielectric constant (k=3.9) of silicon oxide ($SiO_2$).

As illustrated in FIG. 4, the memory transistor layer 30 has memory holes 33.

Each memory hole 33 is formed to penetrate a protection layer 32 and word-line conductive layers 31a to 31d. The memory holes 33 are formed at positions matching the source-side holes 26. The memory holes 33 are formed in a matrix form within a plane provided in the row and column directions.

As illustrated in FIGS. 3 and 4, the memory transistor layer 30 has memory gate insulation layers 34 and memory columnar semiconductor layers 35.

Figure 5:
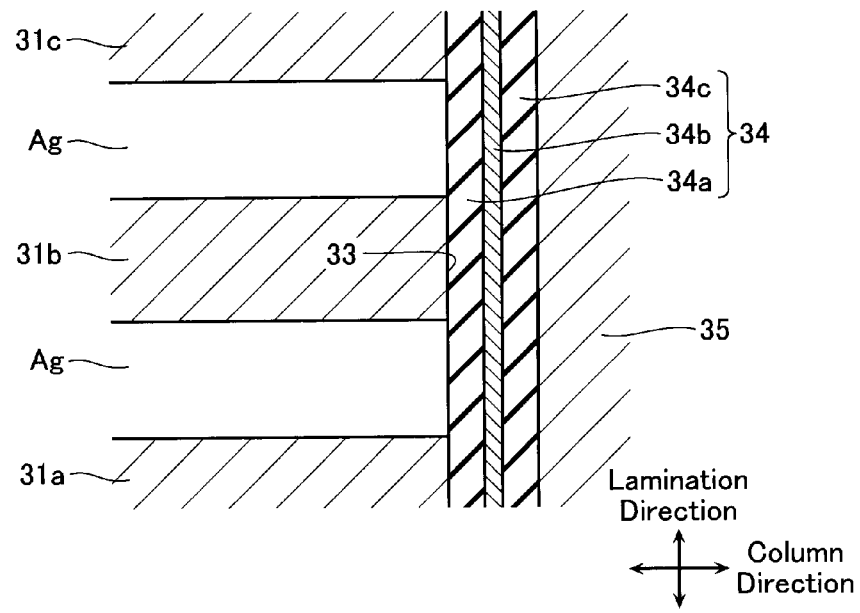
FIG. 5 is a partial enlarged view of FIG. 4.

The memory gate insulation layers 34 are formed on the side surfaces of the memory holes 33. As illustrated in FIG. 5, each memory gate insulation layer 34 has a block insulation layer 34a, an electric charge accumulation layer 34b, and a tunnel insulation layer 34c. The block insulation layer 34a is formed on the side surface of the memory hole 33. The electric charge accumulation layer 34b is formed on the side surface of the block insulation layer 34a. The tunnel insulation layer 34c is formed on the side surface of the electric charge accumulation layer 34b.

Each memory columnar semiconductor layer 35 is formed in a columnar shape extending in the lamination direction. Each memory columnar semiconductor layer 35 is formed in contact with the side surface of a respective tunnel insulation layer 34c and the top surface of a respective source-side columnar semiconductor layer 28. Each memory columnar semiconductor layer 35 is formed to fill up a respective memory hole 33. The memory columnar semiconductor layers 35 are formed in a matrix form within a plane provided in the row and column directions.

The block insulation layers 34a comprise aluminum oxide ($Al_2O_3$) (dielectric constant: k=10). That is, the block insulation layers 34a comprise a material with a higher dielectric constant than that of silicon oxide ($SiO_2$) (dielectric constant: k=3.9). The tunnel insulation layers 34c comprise silicon oxide ($SiO_2$) (dielectric constant: k=3.9). The electric charge accumulation layers 34b comprise silicon nitride (SiN). The memory columnar semiconductor layers 35 comprise polysilicon (p-Si).

In the configuration of the memory transistor layer 30, the word-line conductive layers 31a to 31d function as the control gate electrodes of the memory transistors MTr1 to MTr4. The word-line conductive layers 31a to 31d also function as word lines WL1 to WL4.

The above-mentioned configuration of the memory transistor layer 30 is restated as follows: the tunnel insulation layers 34c are formed to surround the memory columnar semiconductor layers 35; the electric charge accumulation layers 34b are formed to surround the tunnel insulation layers 34c; the block insulation layers 34a are formed to surround the electric charge accumulation layers 34b; and the word-line conductive layers 31a to 31d are formed to surround the block insulation layers 34a.

As illustrated in FIGS. 3 and 4, the drain-side selection transistor layer 40 has drain-side first insulation layers 41, drain-side conductive layers 42, drain-side second insulation layers 43, and interlayer insulation layers 44 on the semiconductor substrate Ba.

The drain-side first insulation layers 41, the drain-side conductive layers 42, and the drain-side second insulation layers 43 are sequentially laminated on the semiconductor substrate Ba. The drain-side first insulation layers 41, the drain-side conductive layers 42, and the drain-side second insulation layers 43 are formed in a stripe pattern extending in the row direction at a certain pitch in the column direction. That is, the respective side surfaces of the drain-side first insulation layers 41, the drain-side conductive layers 42, and the drain-side second insulation layers 43 involve trenches 45 extending in the row direction. The interlayer insulation layers 44 are formed to fill up the trenches 45.

The drain-side first insulation layers 41, the drain-side second insulation layers 43, and the interlayer insulation layers 44 comprise silicon oxide ($SiO_2$). The drain-side conductive layers 42 comprise polysilicon (p-Si).

As illustrated in FIG. 4, the drain-side selection transistor layer 40 has drain-side holes 46.

Each drain-side hole 46 is formed to penetrate a drain-side first insulation layer 41, a drain-side conductive layer 42, and a drain-side second insulation layer 43. The drain-side holes 46 are formed at positions matching the memory holes 33. The drain-side holes 46 are formed in a matrix form within a plane provided in the row and column directions.

As illustrated in FIGS. 3 and 4, the drain-side selection transistor layer 40 has drain-side gate insulation layers 47 and drain-side columnar semiconductor layers 48.

The drain-side gate insulation layers 47 are formed with a certain thickness on the side surfaces of the drain-side holes 46. The drain-side columnar semiconductor layers 48 are formed in a columnar shape extending in the lamination direction. The drain-side columnar semiconductor layers 48 are formed in contact with the side surfaces of the drain-side gate insulation layers 47 and the top surfaces of the memory columnar semiconductor layers 35. The drain-side columnar semiconductor layers 48 are formed to fill up the drain-side holes 46. The drain-side columnar semiconductor layers 48 are formed in a matrix form within a plane provided in the row and column directions.

The drain-side gate insulation layers 47 comprise aluminum oxide ($Al_2O_3$) (dielectric constant: k=10) or silicon oxide ($SiO_2$) (dielectric constant: k=3.9).

In the configuration of the drain-side selection transistor layer 40, the drain-side conductive layers 42 function as the control gate electrodes of drain-side selection transistors SDTr. In addition, the drain-side conductive layers 42 function as drain-side selection gate lines SGD.

The above-mentioned configuration of the drain-side selection transistor layer 40 is restated as follows: the drain-side gate insulation layers 47 are formed to surround the drain-side columnar semiconductor layers 48; and the drain-side conductive layers 42 are formed to surround the drain-side gate insulation layers 47.

(Manufacturing Method of Non-Volatile Semiconductor Storage Device 100 in First Embodiment)

Referring now to FIGS. 6 to 13, a method of manufacturing the non-volatile semiconductor storage device 100 according to the first embodiment will be described below. FIGS. 6 to 13 are cross-sectional views of the non-volatile semiconductor storage device 100 in a manufacturing process according to the first embodiment.

Figure 6:
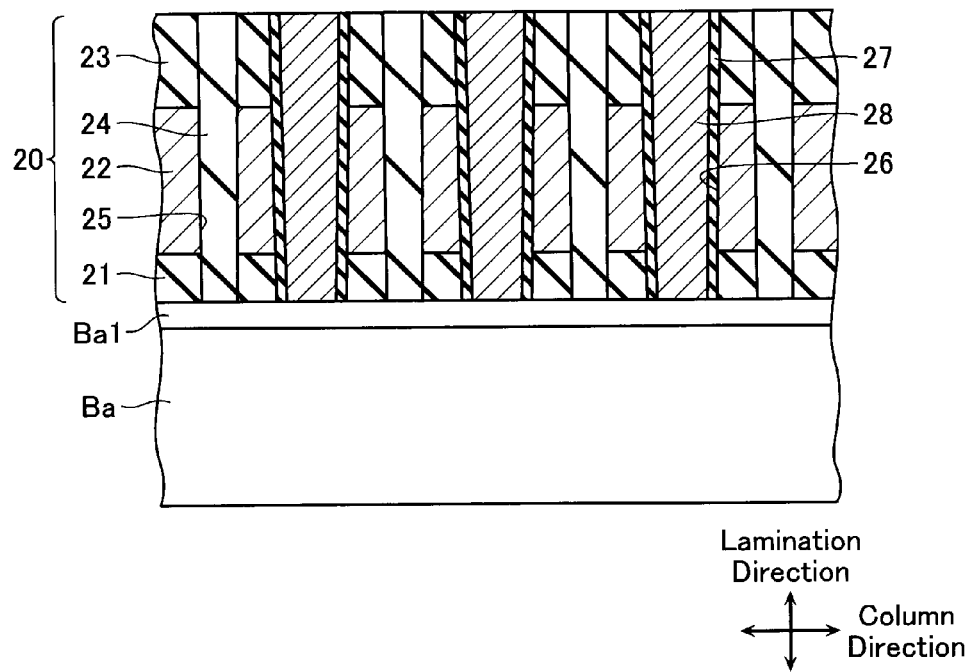
FIG. 6 is a cross-sectional view of the non-volatile semiconductor storage device 100 in a manufacturing process according to the first embodiment.

Firstly, as illustrated in FIG. 6, a source-side selection transistor layer 20 is formed on the semiconductor substrate Ba.

Figure 7:
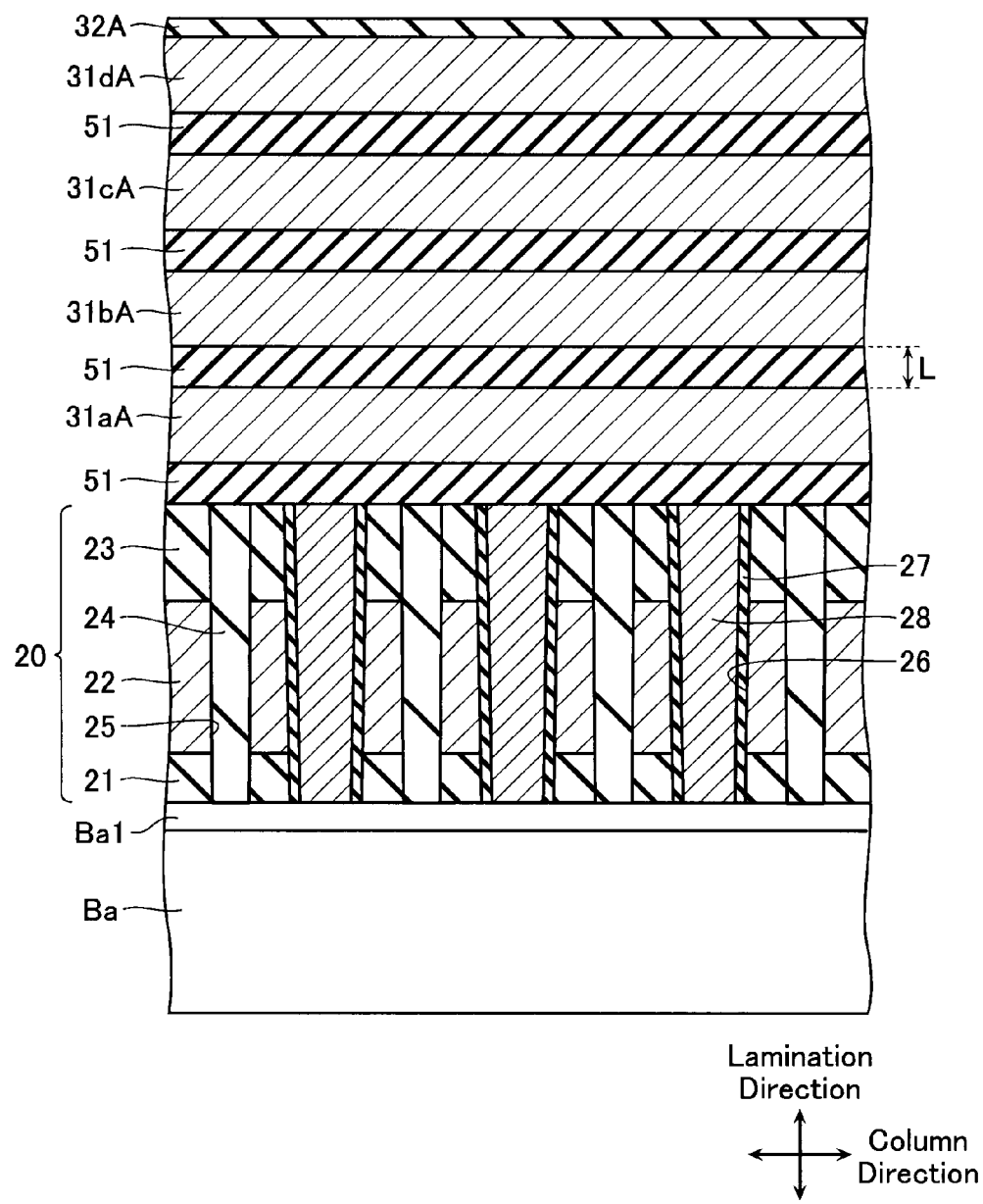
FIG. 7 is a cross-sectional view of the non-volatile semiconductor storage device 100 in the manufacturing process according to the first embodiment.

Then, as illustrated in FIG. 7, silicon oxide ($SiO_2$) and polysilicon (p-Si) are alternately laminated on the source-side selection transistor layer 20. Finally, silicon nitride (SiN) is deposited thereon. With this configuration, four layers 31aA to 31dA are sequentially formed on the source-side selection transistor layer 20 via sacrificial layers 51. A layer 32A is also formed on the top surface of the layer 31dA. In this case, each sacrificial layer 51 is formed with a certain thickness L in the lamination direction.

Figure 8:
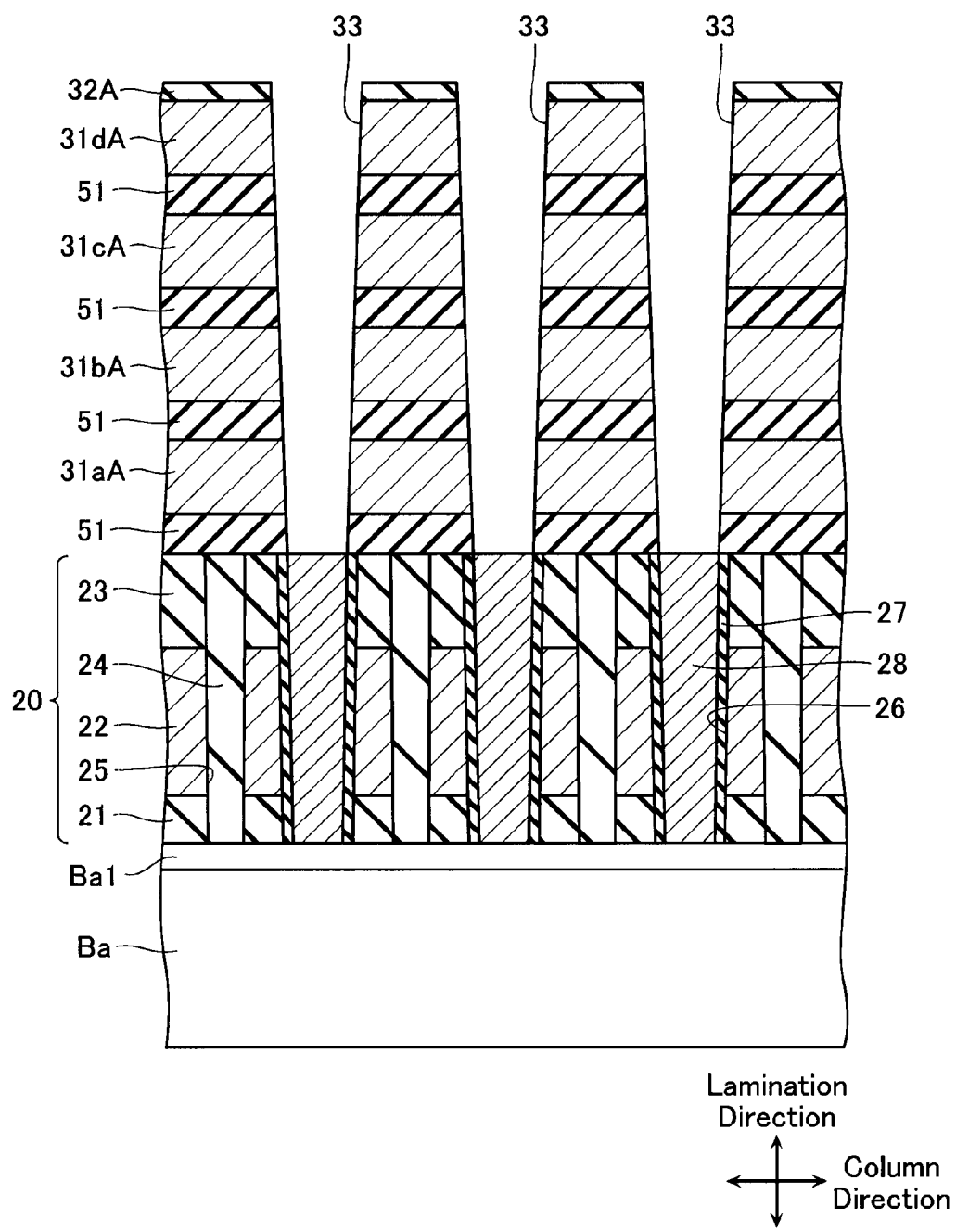
FIG. 8 is a cross-sectional view of the non-volatile semiconductor storage device 100 in the manufacturing process according to the first embodiment.

Subsequently, as illustrated in FIG. 8, memory holes 33 are formed to penetrate the layer 32A, layers 31aA to 31dA, and sacrificial layers 51. The memory holes 33 are formed at positions matching the source-side holes 26.

Figure 9:
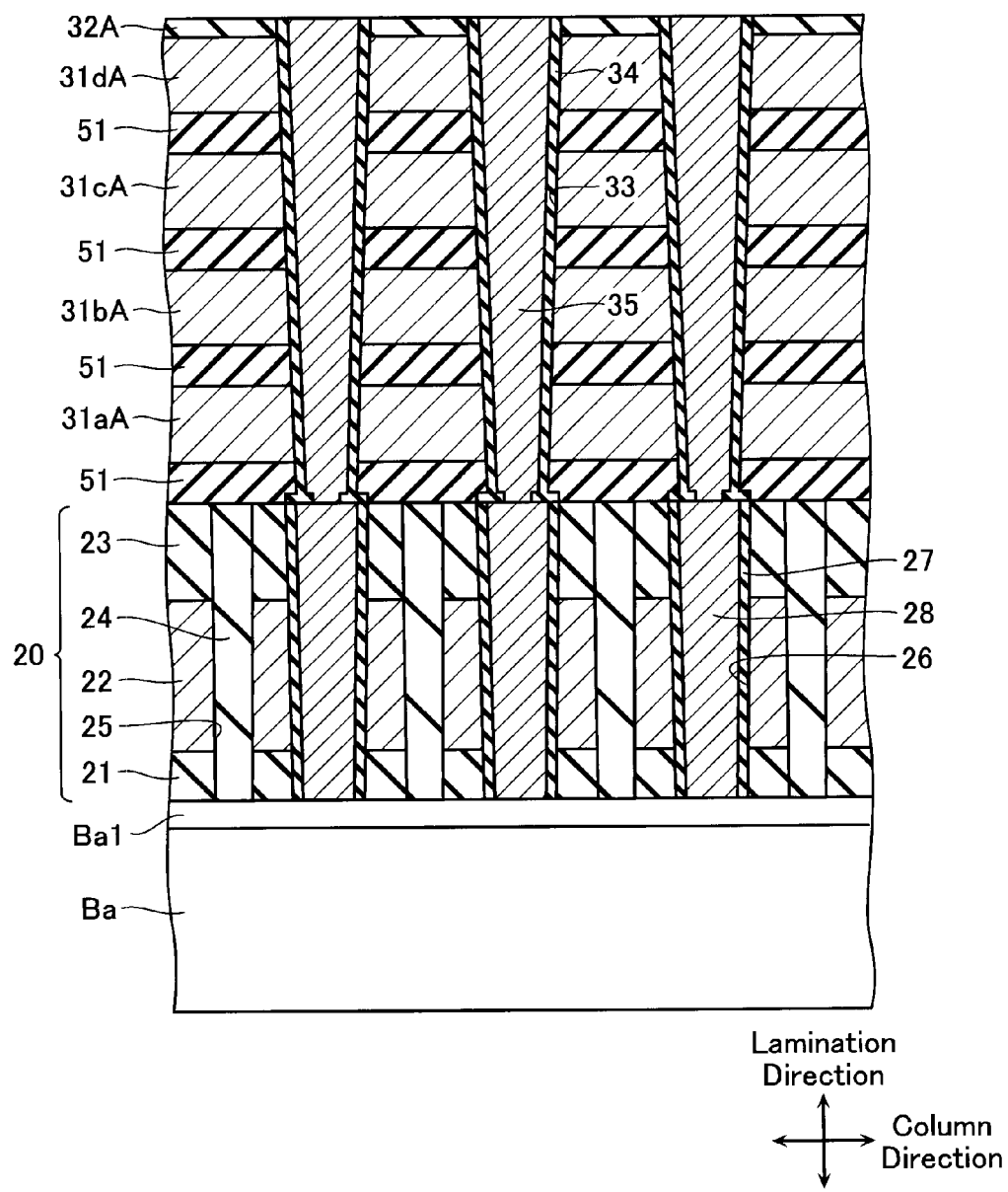
FIG. 9 is a top plan view of the non-volatile semiconductor storage device 100 in the manufacturing process according to the first embodiment.

Then, as illustrated in FIG. 9, aluminum oxide ($Al_2O_3$), silicon nitride (SiN), silicon oxide ($SiO_2$), and polysilicon (p-Si) are sequentially deposited on the side surfaces of the memory holes 33. Through these steps, memory gate insulation layers 34 and memory columnar semiconductor layers 35 are formed in the memory holes 33.

Figure 10:
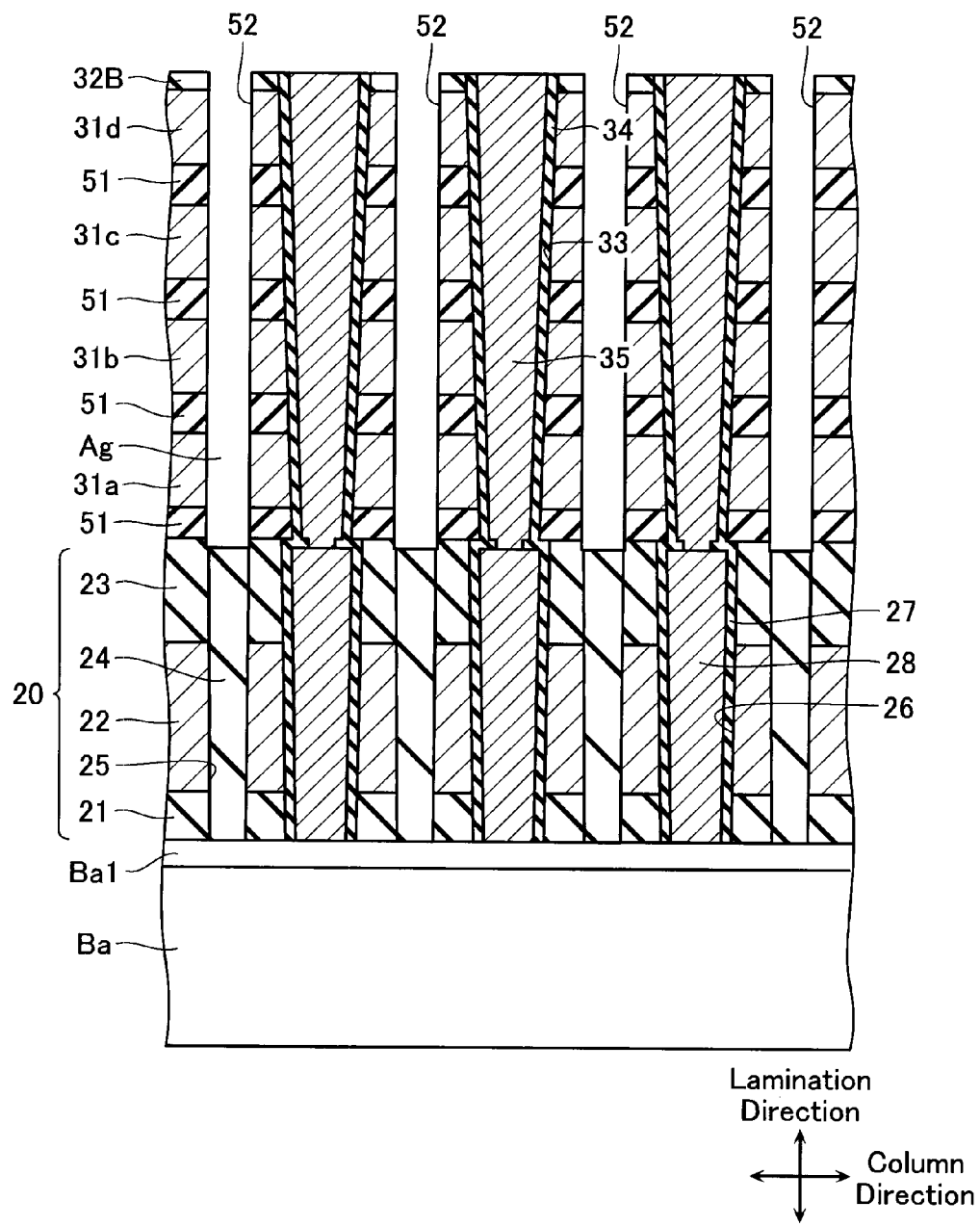
FIG. 10 is a cross-sectional view of the non-volatile semiconductor storage device 100 in the manufacturing process according to the first embodiment.

Subsequently, as illustrated in FIG. 10, trenches 52 are formed to penetrate the layers 32A, the layers 31aA to 31dA, and the sacrificial layers 51. The trenches 52 are formed between the memory holes 33 adjacent in the column direction. The trenches 52 are formed to extend in the row direction. Through these steps, the layers 31aA to 31dA provide word-line conductive layers 31a to 31d. The layers 32A provide layers 32B. Note that the side surfaces of the word-line conductive layers 31a to 31d involve gaps Ag.

Figure 11:
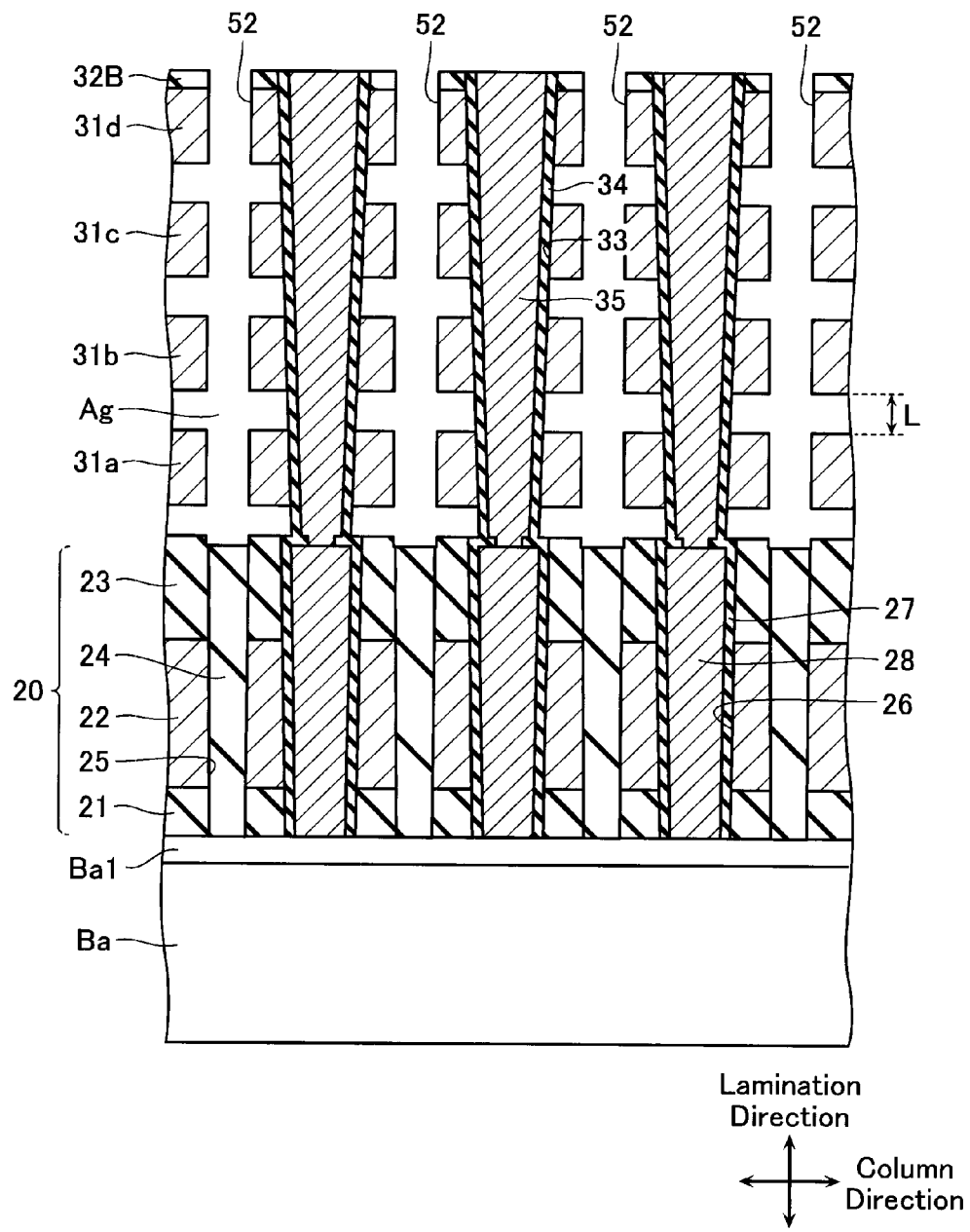
FIG. 11 is a top plan view of the non-volatile semiconductor storage device 100 in the manufacturing process according to the first embodiment.

Then, as illustrated in FIG. 11, hydrofluoric acid treatment is performed to remove the sacrificial layers 51 through the trenches 52. As a result, the spaces that were previously occupied by the sacrificial layers 51 provide gaps Ag.

Figure 12:
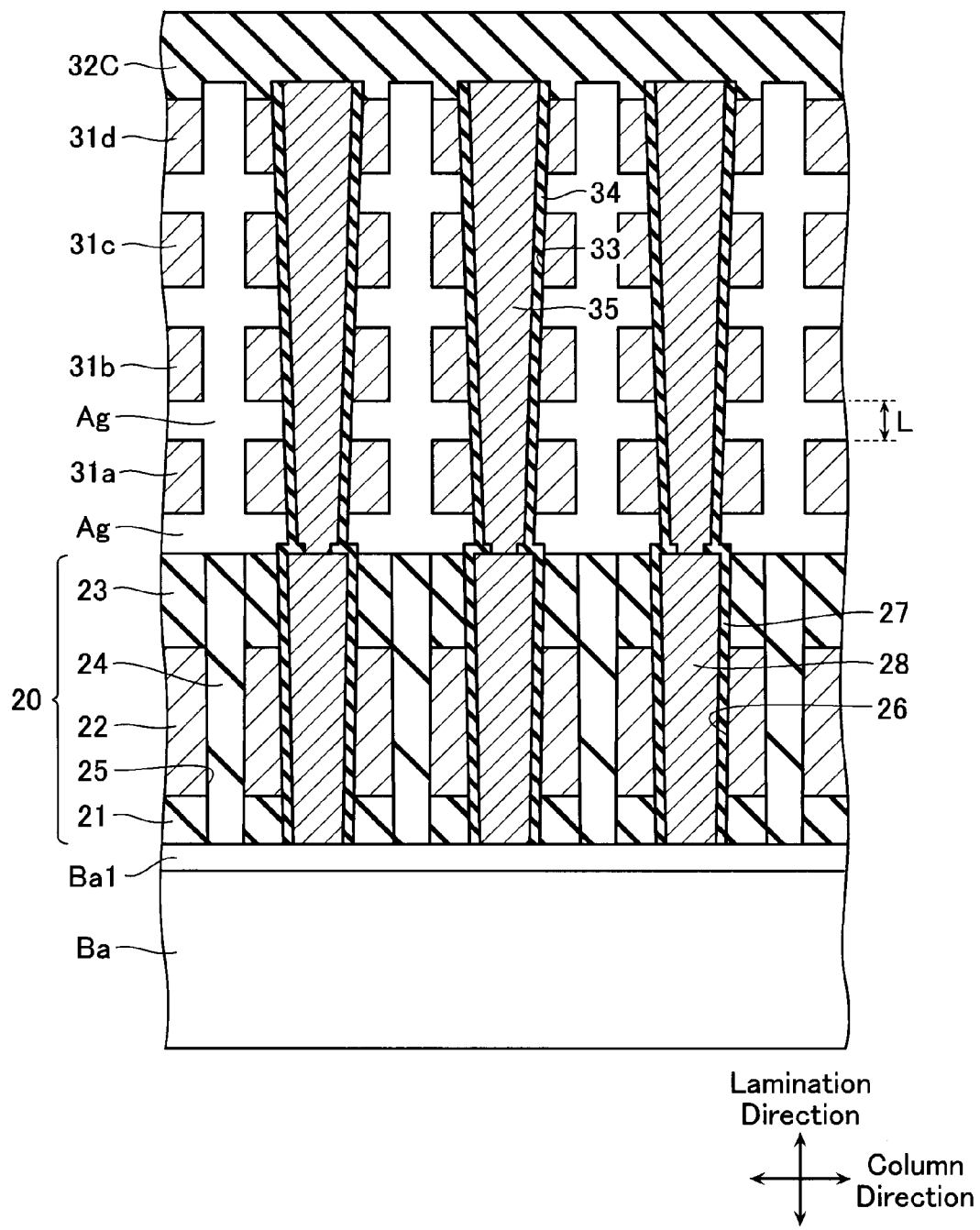
FIG. 12 is a cross-sectional view of the non-volatile semiconductor storage device 100 in the manufacturing process according to the first embodiment.

Subsequently, as illustrated in FIG. 12, silicon nitride (SiN) is deposited on the layers 32B using a film formation method with lower filling characteristics. Through this step, the layers 32B provide a layer 32C, which puts a cover over the trenches 52. In this case, for example, a film formation method with lower filling characteristics includes plasma CVD, and so on.

Figure 13:
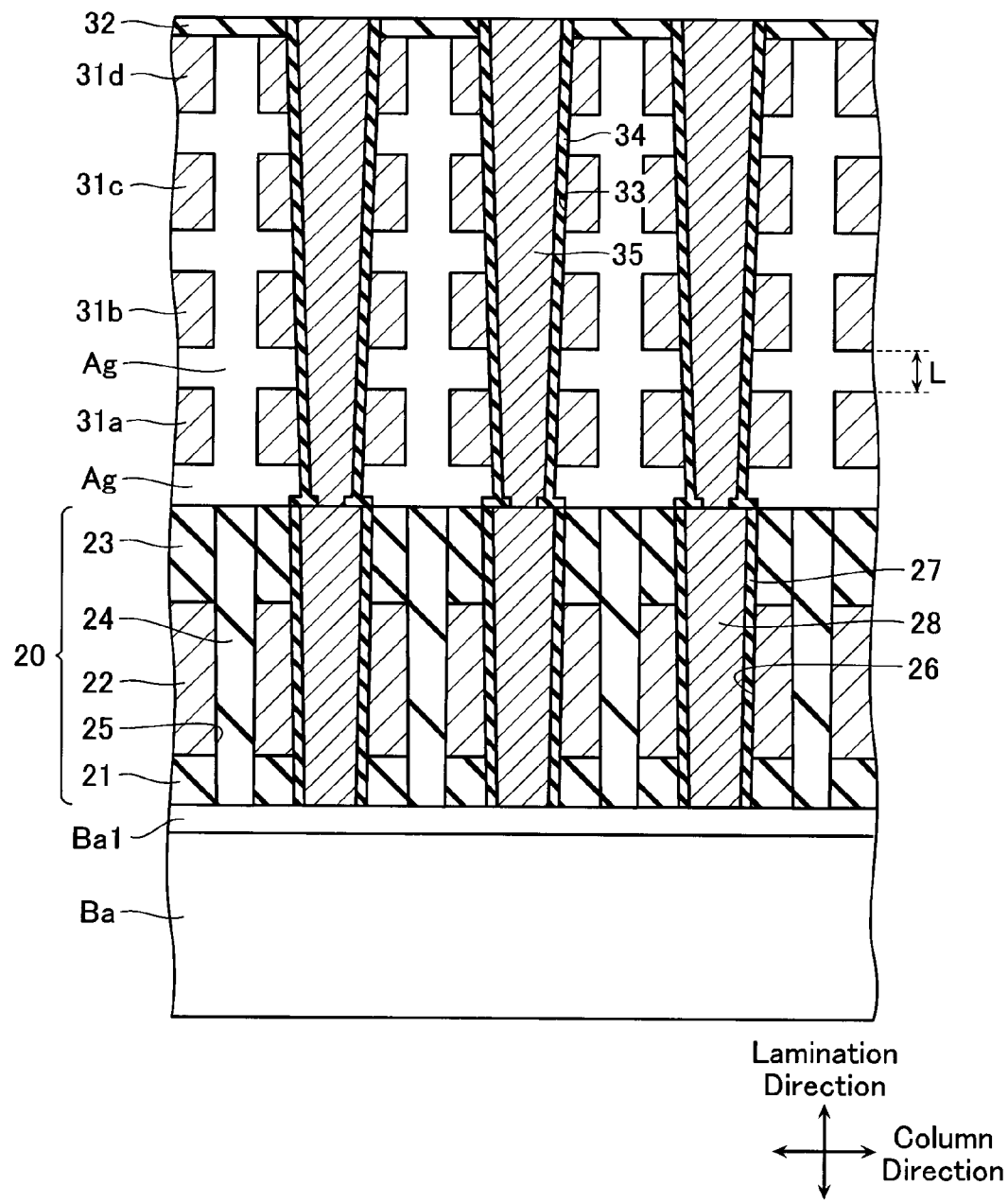
FIG. 13 is a cross-sectional view of the non-volatile semiconductor storage device 100 in the manufacturing process according to the first embodiment.

Then, as illustrated in FIG. 13, an etch-back process is performed on the layer 32C. Through this step, the layer 32C provides protection layers 32. Subsequently, a drain-side selection transistor layer 40 is formed on the protection layers 32, thereby forming the lamination structure as illustrated in FIG. 4.

Second Embodiment

Configuration of Non-Volatile Semiconductor Storage Device in Second Embodiment

Figure 14:
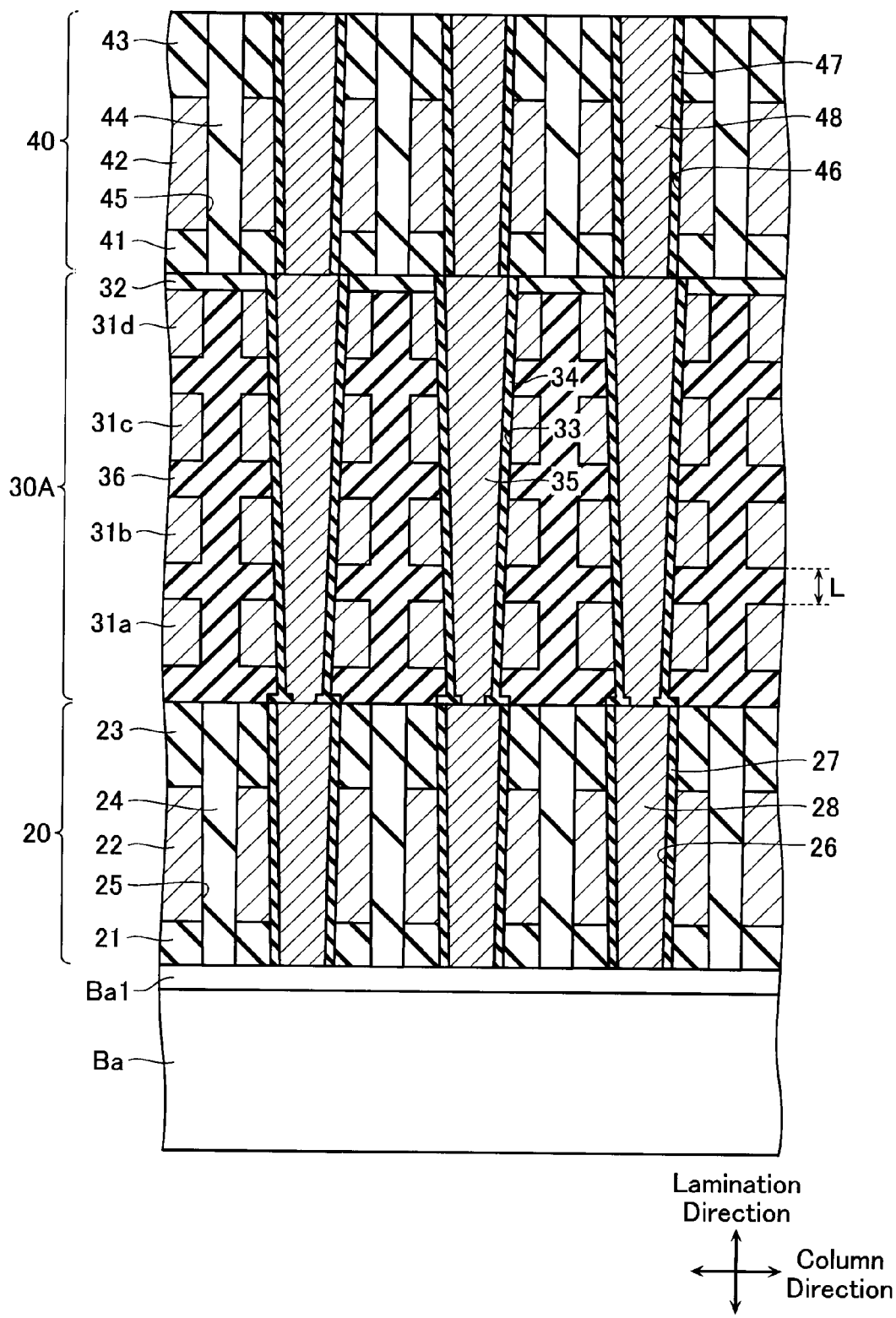
FIG. 14 is a cross-sectional view of a non-volatile semiconductor storage device according to a second embodiment.

Referring now to FIG. 14, a configuration of a non-volatile semiconductor storage device according to a second embodiment will be described below. FIG. 14 is a cross-sectional view of the non-volatile semiconductor storage device according to the second embodiment. Note that the same reference numerals represent the same components as the first embodiment and description thereof will be omitted in the second embodiment.

As illustrated in FIG. 14, the non-volatile semiconductor storage device of the second embodiment comprises a memory transistor layer 30A different from the first embodiment.

In addition to the configuration of the first embodiment, the memory transistor layer 30A further comprises interlayer insulation layers 36. The interlayer insulation layers 36 are formed to fill up the gaps between the word-line conductive layers 31a to 31d. Each interlayer insulation layer 36 has a certain length L in the vertical direction. That is, the word-line conductive layers 31a to 31d are formed at a certain interval L in the vertical direction. The certain length L (certain interval L) is smaller than the vertical length of each interlayer insulation layer corresponding to the destructive breakdown voltage in operation when the gaps between the word-line conductive layers 31a to 31d are filled up with the interlayer insulation layers of silicon oxide ($SiO_2$).

For example, the interlayer insulation layers 36 comprise a coating-type dielectric material (dielectric constant: k=2.4 to 3.0). That is, the interlayer insulation layers 36 have a lower dielectric constant than that of silicon oxide ($SiO_2$) (dielectric constant: k=3.9).

(Manufacturing Method of Non-Volatile Semiconductor Storage Device in Second Embodiment)

A manufacturing method of the non-volatile semiconductor storage device according to the second embodiment will now be described below. Firstly, the steps of FIGS. 6 to 11 are performed as described in the first embodiment. Then, interlayer insulation layers 36 are formed to fill up the trenches 52 and gaps Ag. Thereafter, the steps of FIGS. 12 and 13 are performed as described in the first embodiment, thereby forming the non-volatile semiconductor storage device as illustrated in FIG. 14 according to the second embodiment.

[Advantages of Non-Volatile Semiconductor Storage Device in First and Second Embodiments]

(Dielectric Constant and Advantages Derived from Intervals Between Word-Line Conductive Layers 31a-31d)

Advantages of the non-volatile semiconductor storage device according to the first and second embodiments will now be described below. In the following, reference is made first to the dielectric constant and advantages derived from intervals between the word-line conductive layers 31a to 31d.

According to the first and second embodiments, the word-line conductive layers 31a to 31d are formed at a certain interval L in a vertical direction with respect to the semiconductor substrate Ba.

The gaps Ag formed between the word-line conductive layers 31a to 31d are maintained, for example, under a substantially vacuum condition (k≈1). In addition, they have a lower dielectric constant than that of silicon oxide ($SiO_2$).

In addition, according to the second embodiment, the interlayer insulation layers 36 formed between the word-line conductive layers 31a to 31d comprise, for example, a coating-type dielectric material (dielectric constant: k=2.4 to 3.0). The interlayer insulation layers 36 have a lower dielectric constant (k=2.4 to 3.0) than that of silicon oxide ($SiO_2$).

With the above-mentioned configuration, a larger electric field is applied to the surface of the channel of the dielectric between the word-line conductive layers 31a to 31d, as compared with the case where the gaps between the word-line conductive layers 31a to 31d are filled up with the interlayer insulation layers of silicon oxide ($SiO_2$). This may reduce the resistance of relevant memory strings MS. That is, the non-volatile semiconductor storage device according to the first and second embodiments may increase cell currents during read operation.

Figure 15:
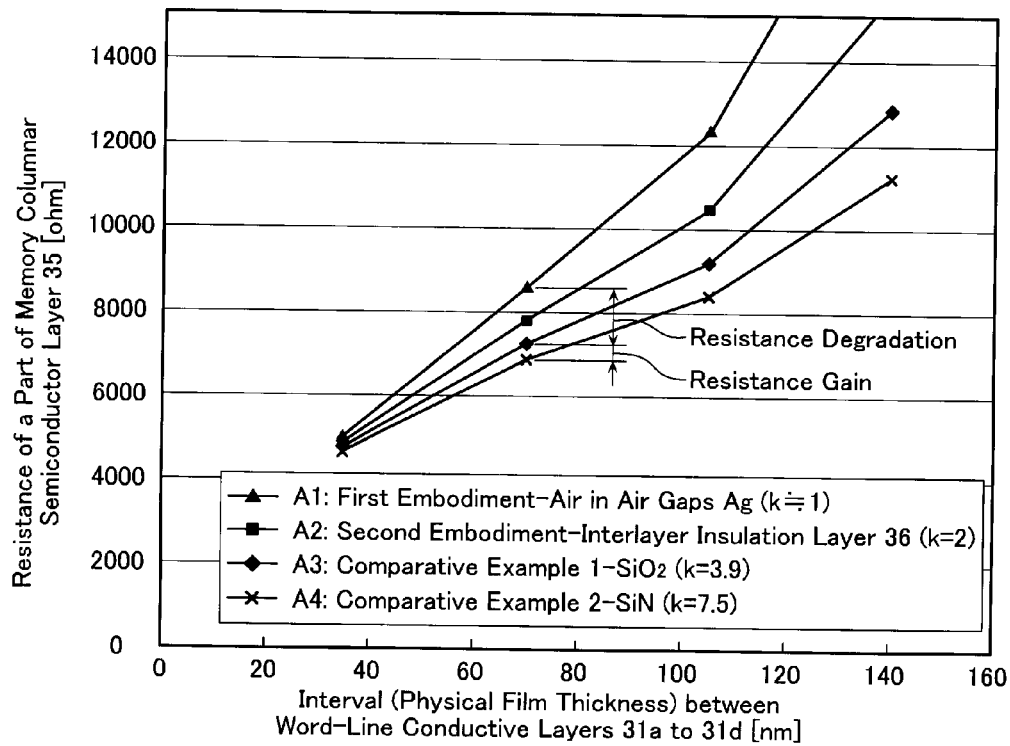
FIG. 15 illustrates relationship between an interval (physical film thickness) between the word-line conductive layers 31a to 31d and a resistance of a part of a memory columnar semiconductor layer 35, with a different configuration provided between the word-line conductive layers 31a to 31d.
Figure 16:
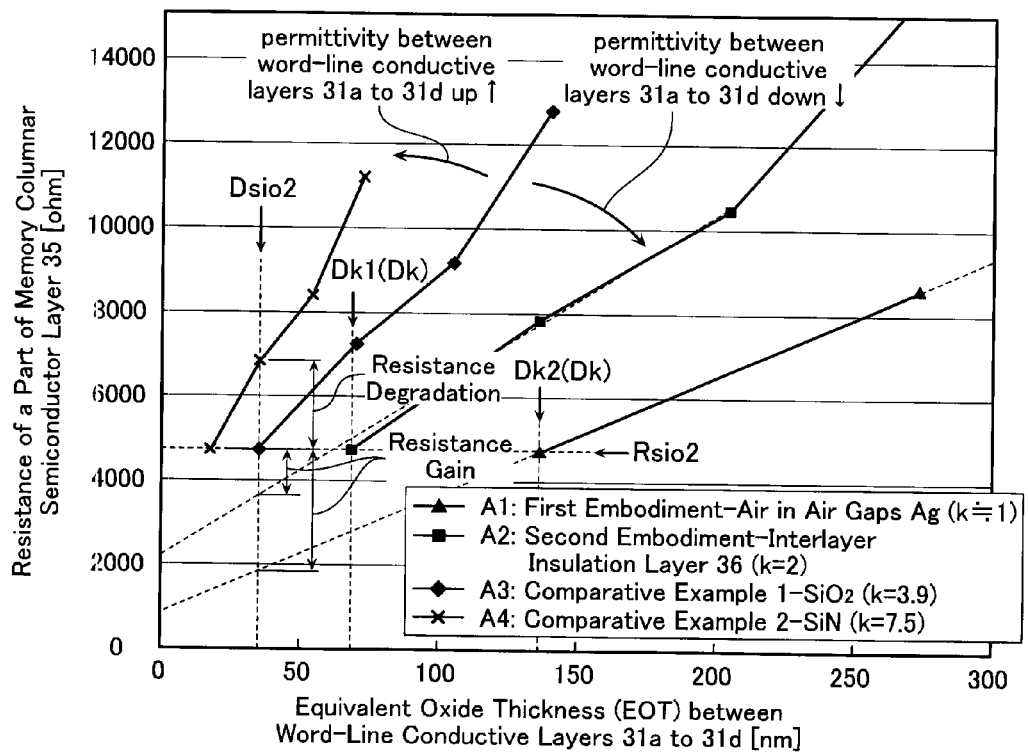
FIG. 16 is a graph where the interval (physical film thickness) between the word-line conductive layers 31a to 31d, corresponding to the horizontal axis of FIG. 15, is converted to the equivalent oxide thickness (EOT)

Referring now to FIGS. 15 and 16, a specific description will be made on the factors that cause advantages mentioned above. FIG. 15 illustrates relationship between an interval (physical film thickness) between the word-line conductive layers 31a to 31d and a resistance of a part of a memory columnar semiconductor layer 35 located on the side surface of a word-line conductive layer 31d, with a different kind of dielectric embedded as interlayer insulation layers between the word-line conductive layers 31a to 31d. Specifically, the resistance of a part of a memory columnar semiconductor layer 35 represents the resistance of a memory columnar semiconductor layer 35 for each of the word-line conductive layers 31a to 31d. FIG. 15 indicates the first embodiment by a line segment A1 and the second embodiment by a line segment A2. In the first embodiment described above, the dielectric provided between the word-line conductive layers 31a to 31d is the vacuum (dielectric constant: k≈1) in the gaps Ag. In the second embodiment described above, the dielectric provided between the word-line conductive layers 31a to 31d is the interlayer insulation layer 36 (dielectric constant: k=2). In addition to the first and second embodiments A1 and A2, FIG. 15 also indicates comparative examples 1 and 2 by line segments A3 and A4. In the comparative example 1, the dielectric provided between the word-line conductive layers 31a to 31d is silicon oxide ($SiO_2$) (dielectric constant: k=3.9). In the comparative example 2, the dielectric provided between the word-line conductive layers 31a to 31d is silicon nitride (SiN) (dielectric constant: k=7.5).

As illustrated in FIG. 15, for the same physical film thickness (interval), the higher the dielectric constant of the dielectric provided between the word-line conductive layers 31a to 31d, the lower the resistance value of the memory columnar semiconductor layer 35 for each of the word-line conductive layers 31a to 31d. When referring only to FIG. 15 from the viewpoint of an increase in cell current during read operation, it seems that it is preferable to use a material with a higher dielectric constant as the dielectric between the word-line conductive layers 31a to 31d. However, increasing the dielectric constant of the dielectric, while maintaining its physical film thickness constant, would lead to a reduction in destructive breakdown voltage.

FIG. 16 is a graph where the physical film thickness (interval) between the word-line conductive layers 31a to 31d, corresponding to the horizontal axis of FIG. 15, is converted to the equivalent oxide thickness (EOT). In this case, the equivalent oxide thickness (EOT) can be expressed by the following formula (1). The same equivalent oxide thickness (EOT) has the same capacity. Note that T denotes a physical film thickness (m). $\in_{ox}$ is the dielectric constant (k=3.9) of silicon oxide ($SiO_2$). $\in_x$ is the dielectric constant of the dielectric provided between the word-line conductive layers 31a to 31d.

$$EOT = T \times (\in_{ox}/\in_x) \quad (1)$$

As can be seen from Formula (1), in order to obtain a constant equivalent oxide thickness (EOT), a larger physical film thickness (interval) is required for a larger dielectric constant $\in_x$.

As illustrated in FIG. 16, for the same equivalent oxide thickness (EOT), the lower the dielectric constant of the substance provided between the word-line conductive layers 31a to 31d, the lower the resistance value of the word-line conductive layers 31a to 31d.

Referring now to FIG. 16, the conditions of a certain interval L will be described below according to the first and second embodiments. According to the first embodiment, a certain interval L is set so that the air (dielectric) in the gaps Ag has an equivalent oxide thickness $D_{EOT}$ that satisfies the following formula (2). In addition, according to the second embodiment, a certain interval L is set so that each interlayer insulation layer 36 (dielectric) has an equivalent oxide thickness $D_{EOT}$ that satisfies the following formula (2):

$$D_{sio2} < D_{EOT} < D_k \quad (2)$$

As illustrated in FIG. 16, $D_{SiO2}$ in Formula (2) denotes a thickness of silicon oxide when the dielectric between the word-line conductive layers 31a to 31d is composed of silicon oxide and when the silicon oxide has a minimum thickness that can withstand a maximum voltage to be applied to the word-line conductive layers 31a to 31d.

As illustrated in FIG. 16, $D_k$ in Formula (2) denotes such an equivalent oxide thickness of the air in the gaps Ag that provides a resistance value Rsio2 in the first embodiment. In addition, $D_k$ in Formula (2) denotes such an equivalent oxide thickness of each interlayer insulation layer 36 that provides a resistance value Rsio2 in the second embodiment. In FIG. 16, $D_k$ of the first embodiment is indicated by "$D_{k1}$", while $D_k$ of the second embodiment is indicated by "$D_{k2}$". As illustrated in FIG. 16, the resistance value Rsio2 represents a resistance value of a memory columnar semiconductor layer 35 for each of the word-line conductive layers 31a to 31d, where the dielectric between the word-line conductive layers 31a to 31d is composed of silicon oxide and the film thickness of silicon oxide is $D_{sio2}$.

Under these conditions of the certain interval L, the non-volatile semiconductor storage device according to the first and second embodiments may achieve a greater reduction in the resistance value of a memory columnar semiconductor layer 35 for each of the word-line conductive layers 31a to 31d than in the comparative examples 1 and 2.

Figure 17:
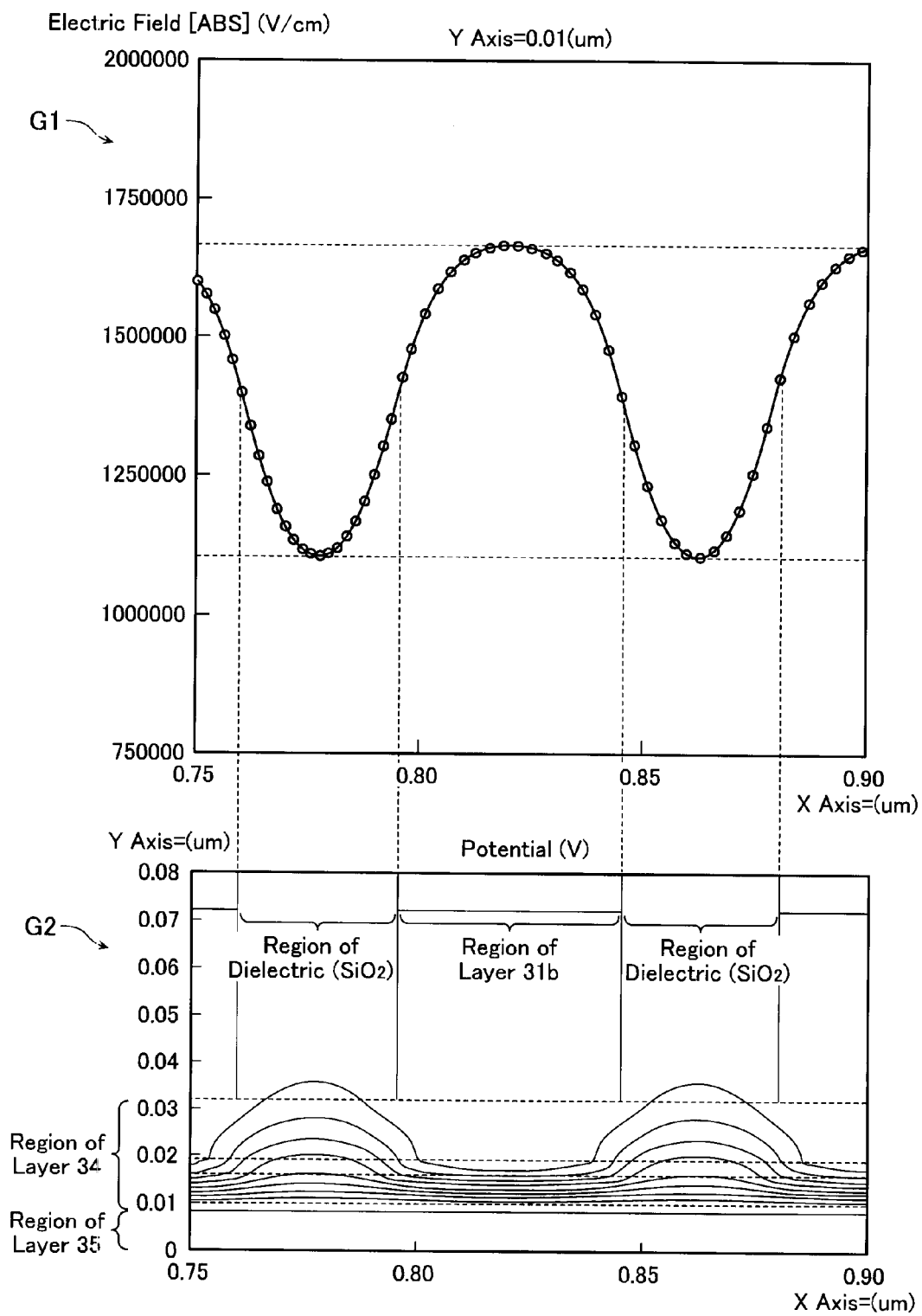
FIG. 17 illustrates the electric field and its distribution when silicon oxide ($SiO_2$) with a film thickness of 35 nm is provided between the word-line conductive layers 31a to 31d.
Figure 18:
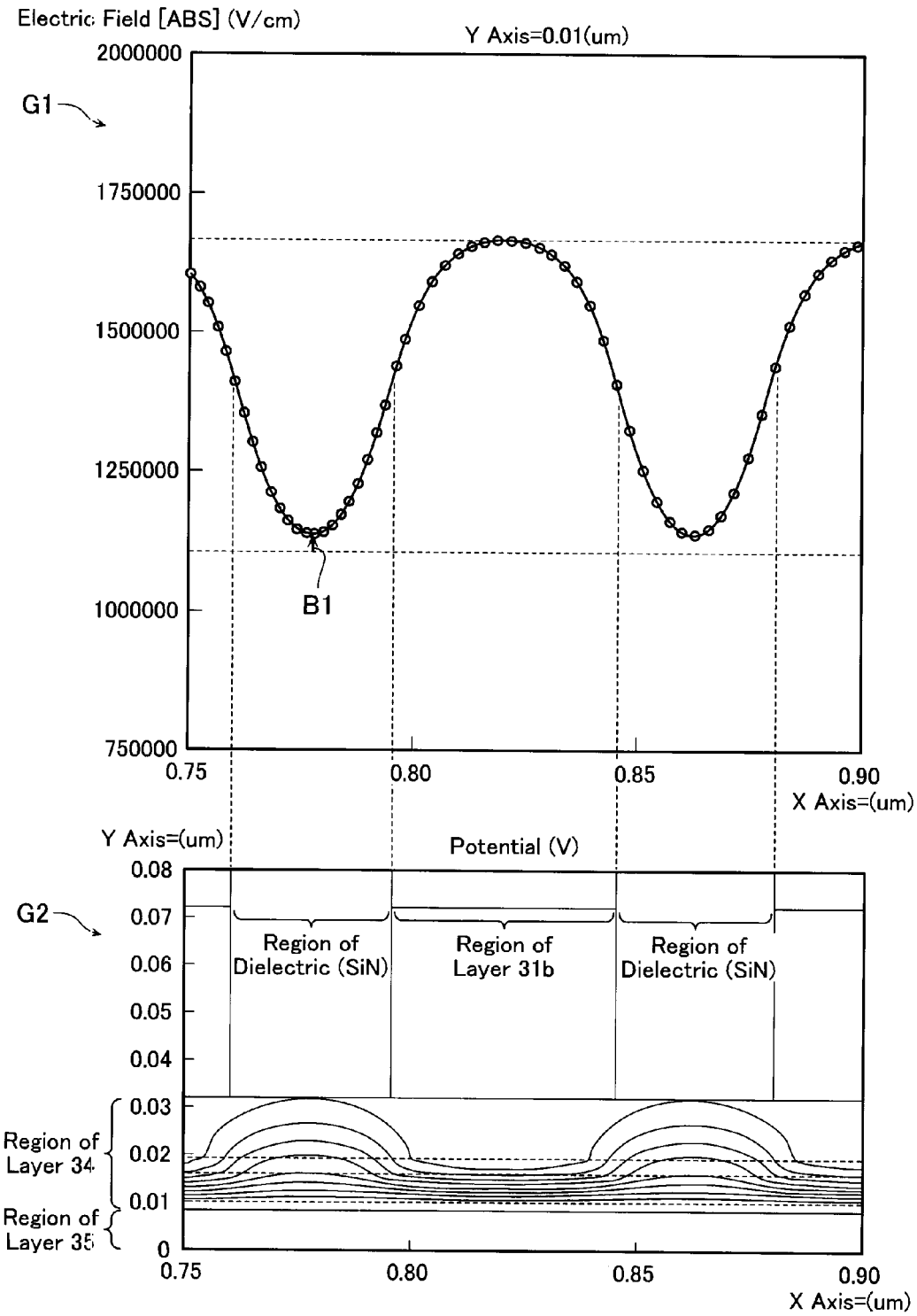
FIG. 18 illustrates the electric field and its distribution when silicon nitride (SiN) with a film thickness of 35 nm is provided between the word-line conductive layers 31a to 31d.
Figure 19:
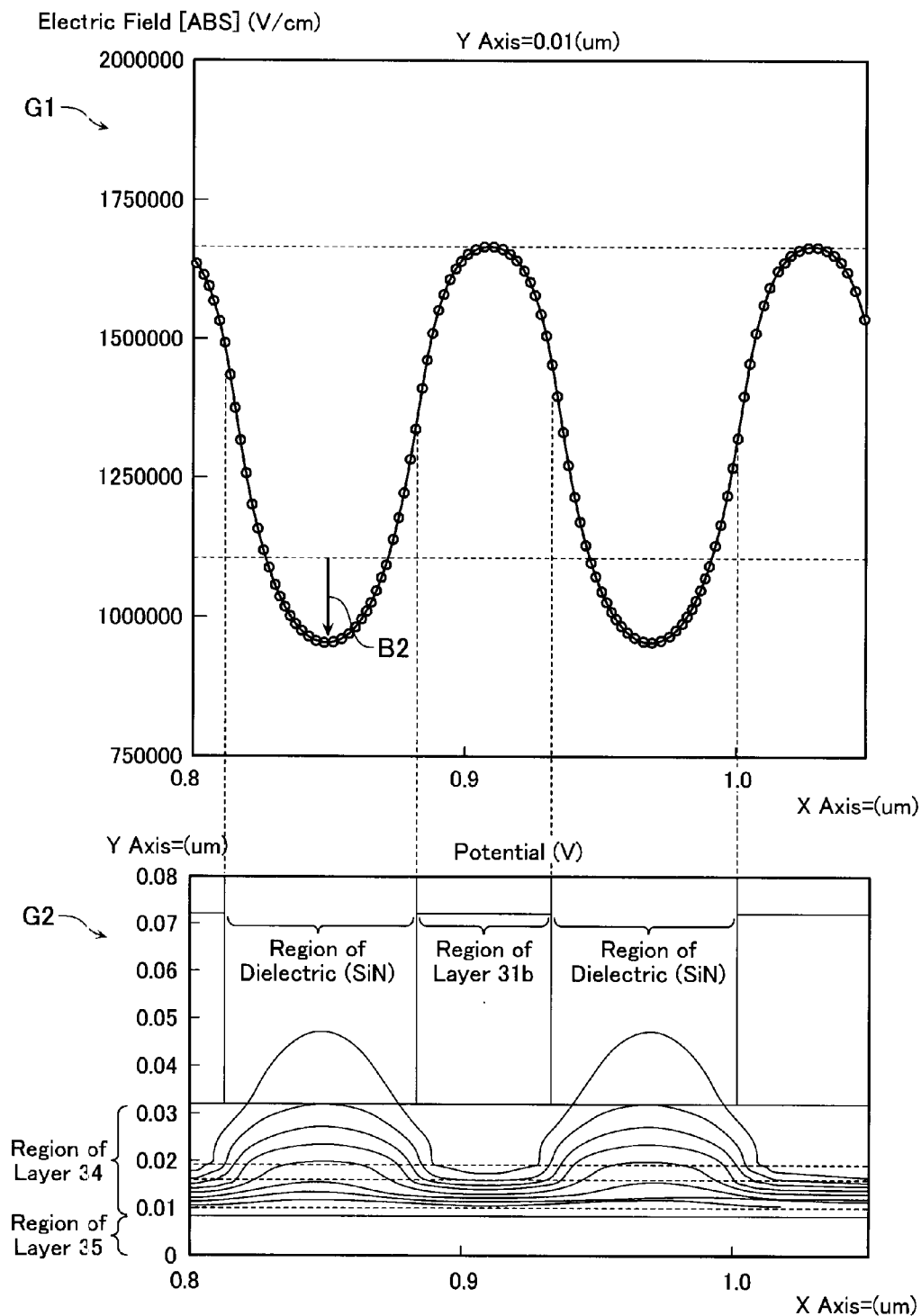
FIG. 19 illustrates the electric field and its distribution when silicon nitride (SiN) with a film thickness of 70 nm is provided between the word-line conductive layers 31a to 31d.

Referring now to FIGS. 17 to 19, a more specific description of each phenomenon illustrated in FIGS. 15 and 16 will be given below. FIG. 17 illustrates the electric field and its distribution when silicon oxide ($SiO_2$) with a film thickness of 35 nm is provided between the word-line conductive layers 31a to 31d. FIG. 18 illustrates the electric field and its distribution when silicon nitride (SiN) with a film thickness of 35 nm is provided between the word-line conductive layers 31a to 31d. That is, FIG. 18 involves the same physical film thickness as FIG. 17. FIG. 19 illustrates the electric field and its distribution when silicon nitride (SiN) with a film thickness of 70 nm is provided between the word-line conductive layers 31a to 31d. That is, FIG. 19 involves the same equivalent oxide thickness as FIG. 17. Each figure indicated by a label "G1" in FIGS. 17 to 19 illustrates the change in electric field (V/cm) along the lamination direction (X Axis) (μm), at a position near the side surface of a memory columnar semiconductor layer 35. Each figure indicated by a label "G2" in FIGS. 17 to 19 illustrates the electric field distribution in the horizontal direction (Y Axis) (μm) and in the lamination direction (X Axis) (μm) with contour lines.

In this case, the dielectric between the word-line conductive layers 31a to 31d has a higher dielectric constant if the substance between the word-line conductive layers 31a to 31d is changed from silicon oxide ($SiO_2$) to silicon nitride (SiN) while maintaining the same physical film thickness. As a result, as illustrated in FIGS. 17 and 18, a larger leakage electric field is produced at the channel of the dielectric between the word-line conductive layers 31a to 31d. Accordingly, as indicated by an arrow B1 in FIG. 18, a larger electric field is applied to the surface of the channel of the dielectric between the word-line conductive layers 31a to 31d, which leads to a reduction in channel resistance.

On the other hand, the physical film thickness becomes larger if the dielectric between the word-line conductive layers 31a to 31d is changed from silicon oxide ($SiO_2$) to silicon nitride (SiN) having a larger dielectric constant, while maintaining the same equivalent oxide thickness. Consequently, as illustrated in FIGS. 17 and 19, a reduction in leakage electric field is observed at the channel of the dielectric between the word-line conductive layers 31a to 31d. Accordingly, as indicated by an arrow B2 in FIG. 19, the electric field applied to the surface of the channel between the word-line conductive layers 31a to 31d is reduced, which leads to an increase in channel resistance.

The description of FIGS. 17 to 19 is summarized as follows: by providing a dielectric between the word-line conductive layers 31a to 31d that has a lower permittivity than silicon oxide and that has a smaller thickness than the minimum thickness in the case of silicon oxide (for obtaining the same equivalent oxide thickness), a larger leakage electric field is produced at the channel of the dielectric between the word-line conductive layers 31a to 31d, and hence the channel resistance decreases. That is, the non-volatile semiconductor storage device according to the first and second embodiments reduces the channel resistance by providing a dielectric with a lower permittivity (such as the air in the gaps Ag or the interlayer insulation layer 36) than the dielectric illustrated in FIGS. 17 to 19 (such as silicon oxide or silicon nitride) and reducing its thickness (for obtaining the same equivalent oxide thickness).

(Advantages Derived from Relative Permittivity of Block Insulation Layers 34a)

Advantages that are derived from the dielectric constant of the block insulation layers 34a will now be described below. The non-volatile semiconductor storage device according to the first and second embodiments comprises the block insulation layers 34a of aluminum oxide ($Al_2O_3$) with a higher dielectric constant than that of silicon oxide ($SiO_2$). With this configuration, a larger electric field is applied to the surface of the channel of the dielectric between the word-line conductive layers 31a to 31d, as compared with the case where the block insulation layers 34a comprise silicon oxide ($SiO_2$). This may reduce the resistance of relevant memory strings MS. That is, the non-volatile semiconductor storage device according to the first and second embodiments may increase cell currents during read operation.

Figure 20:
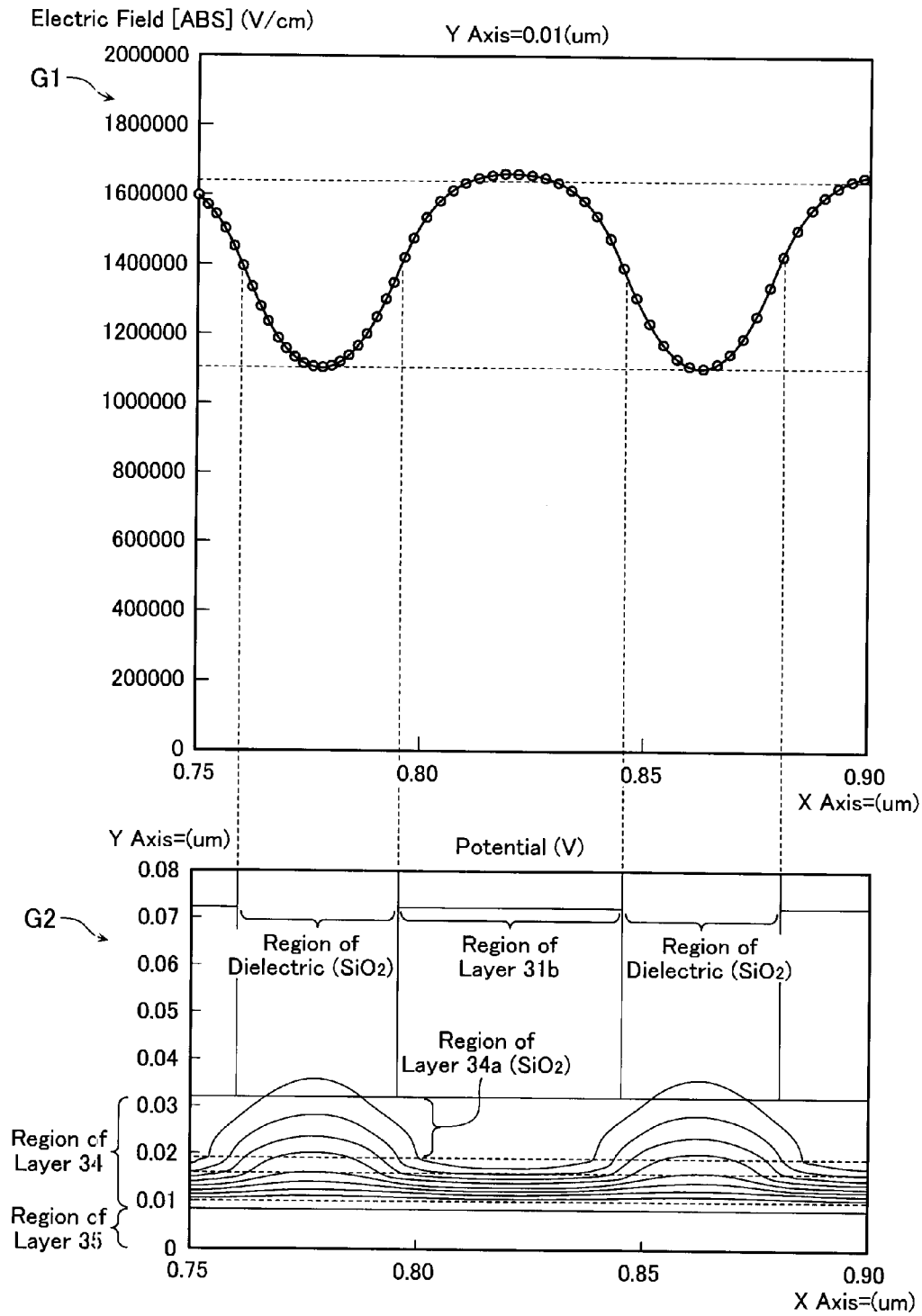
FIG. 20 illustrates the electric field and its distribution when silicon oxide ($SiO_2$) with a film thickness of 35 nm is provided between the word-line conductive layers 31a to 31d and when the block insulation layers 34a comprise silicon oxide ($SiO_2$)

Referring now to FIGS. 20 and 21, a specific description will be made on the factors that cause the advantages mentioned above. FIG. 20 illustrates the electric field and its distribution when silicon oxide ($SiO_2$) with a film thickness of 35 nm is provided between the word-line conductive layers 31a to 31d and when the block insulation layers 34a comprise silicon oxide ($SiO_2$). FIG. 21 illustrates the electric field and its distribution when silicon nitride ($SiO_2$) with a film thickness of 35 nm is provided between the word-line conductive layers 31a to 31d and when the block insulation layers 34a comprise aluminum oxide ($Al_2O_3$).

A higher dielectric constant is provided by changing the block insulation layers 34a from silicon oxide ($SiO_2$) to aluminum oxide ($Al_2O_3$). As a result, as illustrated in FIGS. 20 and 21, a larger leakage electric field is produced at the channel between the word-line conductive layers 31a to 31d. Accordingly, as indicated by an arrow B3 in FIG. 21, a larger electric field is applied to the surface of the channel between the word-line conductive layers 31a to 31d, which leads to a reduction in channel resistance.

For the reasons given above in relation to FIGS. 20 and 21, the non-volatile semiconductor storage device according to the first and second embodiments may achieve an increase in cell current during read operation.

Other Embodiments

While embodiments of the non-volatile semiconductor storage device have been described, the present invention is not intended to be limited to the disclosed embodiments, and various other changes, additions, replacements or the like may be made thereto without departing from the spirit of the invention.

For example, according to the first embodiment, the gaps Ag between the word-line conductive layers 31a to 31d are maintained under a substantially vacuum condition (dielectric constant: k≈1). In addition, according to the second embodiment, the interlayer insulation layers 36 (dielectric constant: k=2) are provided between the word-line conductive layers 31a to 31d. However, the present invention is not intended to be limited to the above-mentioned configuration. Thus, the first embodiment may have such a configuration where a fluid (gas) with a lower dielectric constant than that of silicon oxide ($SiO_2$) is filled into the gaps Ag. In addition, the second embodiment may have any interlayer insulation layers 36 with a lower dielectric constant than that of silicon oxide ($SiO_2$).

Furthermore, according to the first and second embodiments, each memory columnar semiconductor layer 35 is formed in "I" shape as viewed from a direction parallel to the substrate Ba. However, each memory columnar semiconductor layer 35 may be formed in "U" shape, not limited to the "I" shape. That is, each memory columnar semiconductor layer 35 may include a pair of columnar portions and a joining portion that joins the bottom portions thereof.

What is claimed is:

1. A non-volatile semiconductor storage device comprising:
   a plurality of memory strings each having a plurality of electrically rewritable memory cells connected in series, each of the memory strings comprising:
      a first semiconductor layer having a columnar portion extending in a vertical direction with respect to a substrate;
      an electric charge accumulation layer surrounding a side surface of the first semiconductor layer; and
      a plurality of first conductive layers surrounding a side surface of the electric charge accumulation layer and functioning as control electrodes of the memory cells,
   the plurality of first conductive layers being provided at a certain interval L in the vertical direction, with a dielectric sandwiched therebetween,
   the dielectric including a first dielectric with a lower dielectric constant than that of silicon oxide,
   the certain interval L being set so that the first dielectric has an equivalent oxide thickness $D_{EOT}$ that satisfies the following relation (1), wherein the equivalent oxide thickness $D_{EOT}$ is defined as $EOT = T \times (\epsilon_{ox}/\epsilon_x)$, in which T is a physical thickness of the first dielectric, $\epsilon_{ox}$ is the dielectric constant of silicon oxide, and $\epsilon_x$ is the dielectric constant of the first dielectric:

$$D_{sio2} < D_{EOT} < D_k \quad (1)$$

in which $D_{sio2}$ denotes an equivalent oxide thickness of the first dielectric with a minimum thickness that can withstand a maximum voltage to be applied to the first conductive layers, and,
   $R_{sio2}$ defines a resistance value of an entire part of the first semiconductor layer that is adjacent in a direction parallel to the substrate to one of the first conductive layers, and that has an extent between top and bottom surfaces of the one of the first conductive layers, if the first dielectric was composed of silicon oxide having a film thickness of $D_{sio2}$, and
   $D_k$ denotes an equivalent oxide thickness of the first dielectric when the first dielectric provides the resistance value $R_{sio2}$ in the part of the first semiconductor layer.

2. The non-volatile semiconductor storage device according to claim 1, wherein
   the first dielectric comprises vacuum or gas with a lower dielectric constant than that of silicon oxide.

3. The non-volatile semiconductor storage device according to claim 1, wherein
   the first dielectric comprises an interlayer insulation layer with a lower dielectric constant than that of silicon oxide.

4. The non-volatile semiconductor storage device according to claim 1, wherein
   each of the memory strings comprises:
      a first insulation layer formed between the electric charge accumulation layer and the first semiconductor layer; and
      a second insulation layer formed between the electric charge accumulation layer and the first conductive layers, and
   the second insulation layer has a higher dielectric constant than that of silicon oxide.

5. The non-volatile semiconductor storage device according to claim 4, wherein
   the second insulation layer comprises aluminum oxide.

6. The non-volatile semiconductor storage device according to claim 1, further comprising:
   a selection transistor connected to one end of a respective one of the memory strings and controlling conduction of the memory strings,
   wherein the selection transistor comprises:
      a second semiconductor layer extending in the vertical direction from a top or bottom surface of the first semiconductor layer;
      a third insulation layer surrounding a side surface of the second semiconductor layer; and
      a second conductive layer surrounding a side surface of the third insulation layer, and
   the third insulation layer has a higher dielectric constant than that of silicon oxide.

7. The non-volatile semiconductor storage device according to claim 6, wherein
   the third insulation layer comprises aluminum oxide.

8. The non-volatile semiconductor storage device according to claim 1, wherein
   the first conductive layers are formed in a stripe pattern at a certain pitch in a first direction parallel to the substrate.

* * * * *